United States Patent [19]

Min et al.

[11] Patent Number: 4,912,055
[45] Date of Patent: Mar. 27, 1990

[54] METHOD OF FABRICATING A SEMICONDUCTOR DEVICE

[75] Inventors: Sung-Ki Min, Inchun; Chang-Won Kahng, Seoul; Uk-Rae Cho; Jong-Mil Youn, both of Kyoungsangbuk; Suk-Gi Choi, Seoul, all of Rep. of Korea

[73] Assignee: Samsung Electronic Co., Ltd., Suwon, Rep. of Korea

[21] Appl. No.: 265,420

[22] Filed: Oct. 31, 1988

[30] Foreign Application Priority Data

Nov. 3, 1987 [KR] Rep. of Korea ......... 1987-12279[U]

[51] Int. Cl.⁴ ............... H01L 521/364; H01L 27/06
[52] U.S. Cl. ........................ 437/31; 437/57; 357/43
[58] Field of Search ............ 437/32, 31, 33, 56, 437/57, 917, 918; 148/DIG. 10; 357/34, 51, 43

[56] References Cited

U.S. PATENT DOCUMENTS

| | | | |
|---|---|---|---|
| 4,403,395 | 9/1983 | Curran | 437/31 |
| 4,475,279 | 10/1984 | Gable | 437/31 |
| 4,484,388 | 11/1984 | Iwasaki | 437/31 |
| 4,637,125 | 1/1987 | Iwasaki et al. | 437/76 |
| 4,760,033 | 7/1988 | Mueller | 437/57 |

FOREIGN PATENT DOCUMENTS

| | | | |
|---|---|---|---|
| 0139266 | 5/1985 | European Pat. Off. | 357/43 |
| 0236153 | 10/1986 | Japan | 357/43 |

OTHER PUBLICATIONS

"Bipolar Device Incorporated into CMOS Technology", IBM Technical Disclosure Bulletin, vol. 28, No. 9, pp. 3813-3815, Feb. 1986.

*Primary Examiner*—Brian E. Hearn
*Assistant Examiner*—Tuan Nguyen
*Attorney, Agent, or Firm*—Robert E. Bushnell

[57] ABSTRACT

A method for fabricating a BiCMOS device to achieve a maximum performance through a of minimum processing steps, in which the BiCMOS device is exemplary for its high integration and high performance MOS transistors, self-aligned metal contact emitter type bipolar transistors having high load driving force, high performance matching characteristics and high integration, and self-aligned polycrystalline silicon emitter type bipolar transistors having high integration and high speed characteristics in low current, thereby being used in high integration, high speed digital and precise analog system. The method includes a plurality of fabrication steps including ion-implantation, formation of a thin film oxide layer, deposition of a nitride layer, etching of the oxide layer, formation of windows and others, alternately and/or sequentially in a single chip substrate.

32 Claims, 14 Drawing Sheets

METHOD OF FABRICATING A SEMICONDUCTOR DEVICE

BACKGROUND OF THE INVENTION

1. Technical Field

This invention relates to a method for fabricating a semiconductor device, and more particularly to a method for forming single crystal semiconductor chip bipolar transistors, CMOS transistors, MOS capacitors, and resistors.

2. Related Art

A semiconductor device including bipolar transistors, and CMOS transistors which are formed on a semiconductor chip is generally called BiCMOS. The VLSI-class BiCMOS technology of prior art has been developed principally for high performance memory or logic, so that it is suitable for high integration and high speed logic. The BiCMOS technology for high performance memory and high speed, low power, high density logic of prior art is disclosed in page 212, ISSCC Digest of Technical Papers published in February, 1986 and in page 63, CICC Tech. Dig. published in May, 1986.

In order to achieve high performance digital and analog VLSI function on a single chip with prior art, there should be provided MOS elements, bipolar elements, resistors, capacitors, etc. for a precise analog function and high speed, high integration digital function. However, because these elements have not been optimized for their construction and performance, there are limitations in their applications. Furthermore, a BiCMOS device of prior art having a complex self-aligned bipolar structure for high speed of the elements complicates the construction thereof, thus being unsuitable for mass production and cost. Alternatively, another BiCMOS device of prior art using non-self-aligned structure reduces its performance. In the bipolar structure of prior art as disclosed in pages 1010–1013, No.9, Vol. Ed-28, IEEE published in September, 1981, it is difficult to reduce the size of the structure due to the problem of the scaling down of the elements. Additionally, the self-aligned bipolar technology as disclosed in pages 338-340, No.8, Vol.ED-8, IEEE provides a method for solving the problem of scaling down of the elements, but the method thereof is complicated. Further, according to the prior art as disclosed in U.S. Pat. No. 4,503,603 of L. Blossfeld, after ion implantation is performed twice into the base region and a local oxidation is done, the emitter region is formed to produce a self-aligned bipolar structure, However, since this method requires a number of heat treatments, it makes it difficult to control the shallow junction depth of the active base layer for forming a high speed and high integration bipolar transistor. Consequently, such a bipolar structure of prior art causes a problem in the method for high performance BiCMOS.

SUMMARY OF THE INVENTION

It is an object of the present invention to provide a method for fabricating a BiCMOS device to have a maximum performance through a minimum processing steps, which BiCMOS device includes high integration and high performance MOS transistors, self-aligned metal contact type bipolar transistors having a high load driving force, high performance matching characteristics and high integration, and self-aligned polycrystalline silicon emitter type bipolar transistors having high integration and high speed characteristics in low current, thereby being used in high integration, high speed digital and precise analog.

It is another object of the present invention to provide a method for fabricating a BiCMOS device, whereby MOS capacitors and resistors are formed on a single chip together with MOS transistors and bipolar transistors through a simple process, and the interconnections between them are easily made, thereby producing the highest performance elements through a minimum of processing steps.

It is a further object of the present invention to provide a method for fabricating a BiCMOS device directed at simplicity and high performance of elements, and accommodates to the accommodation of fine processing technology.

According to the present invention, a method for fabricating a semiconductor device having first and second MOSFETs and first and second bipolar transistors in a first conductivity type silicon substrate, using the steps of:

(a) implanting second conductivity type ions into predetermined regions of said substrate and activating the ion implanted regions so as to form the first region for forming said first MOSFET, the third region for forming said first bipolar transistor, and the fourth region for forming said second bipolar transistor;

(b) forming element-isolation oxide thin film layers between the elements of said transistors so as to isolate said elements from each other on said substrate, and first conductivity-type channel stopper region below said oxide layers;

(c) forming an oxide thin film layer for the gates of said first and second MOSFETs on the upper surface of said substrate;

(d) forming gates of said first and second MOSFETs with doped polycrystalline silicon over the gate oxide in said first and second regions;

(e) depositing a nitride thin film layer for masking on the whole upper surface of said substrate and removing said nitride layer from predetermined portions of said third and fourth regions of said substrate;

(f) etching said oxide layer of predetermined portions of said third and fourth regions and implanting first conductivity-type ions into the etched portions so as to form the inactive base regions of said first and second bipolar transistors;

(g) forming oxide thin film layers on said third and fourth regions of said substrate by employing said nitride layer as a mask;

(h) implanting first conductivity-type ions into predetermined portions of said third and fourth regions of said substrate so as to form the active base regions of said first and second bipolar transistors;

(i) implanting second conductivity-type ions so as to form the low concentration drain and source of said second MOSFET;

(j) forming an oxide thin-film layer on the whole surface of said substrate and etching said oxide layer without any separate mask so as to form oxide-layer spacers on the sidewalls of the gates of said first and second MOSFETs;

(k) implanting second conductivity-type ions so as to form the substrate connecting region of said first MOSFET of said first region, the collector connecting region of said third and fourth regions, the emitter region of said second bipolar transistor, the high concentration drain and source regions of said second MOSFET, and the collector connecting regions of said first and second bipolar transistors;

(l) implanting first conductivity-type ions so as to form the drain and source regions of said first MOSFET of said first region and the substrate connecting region of said second MOSFET of said second region;

(m) forming an oxide thin film layer on the whole surface of said substrate and making the emitter connecting windows of said first bipolar transistor;

(n) forming the emitter connecting portion of said first bipolar transistor with second polycrystalline silicon on the upper portion of said third region;

(o) making the windows for connecting with the drain and source regions of said first and second MOSFETs, the emitter, base and collector regions of said first and second bipolar transistors and the substrate regions of said first and second MOSFETs;

(p) making connections with the conduction layer through said windows; and (q) depositing a protecting layer on the whole surface of said substrate and then exposing a pad for wire-welding.

BRIEF DESCRIPTION OF THE DRAWINGS

FIGS. 1(A)–(P) and 1(A')–(P') illustrate cross-sectionally an embodiment of the method according to the present invention;

DETAILED DESCRIPTION OF PREFERRED EMBODIMENTS

The present invention will be now described more specifically with reference to the drawings attached by way of example only.

Figure 1:
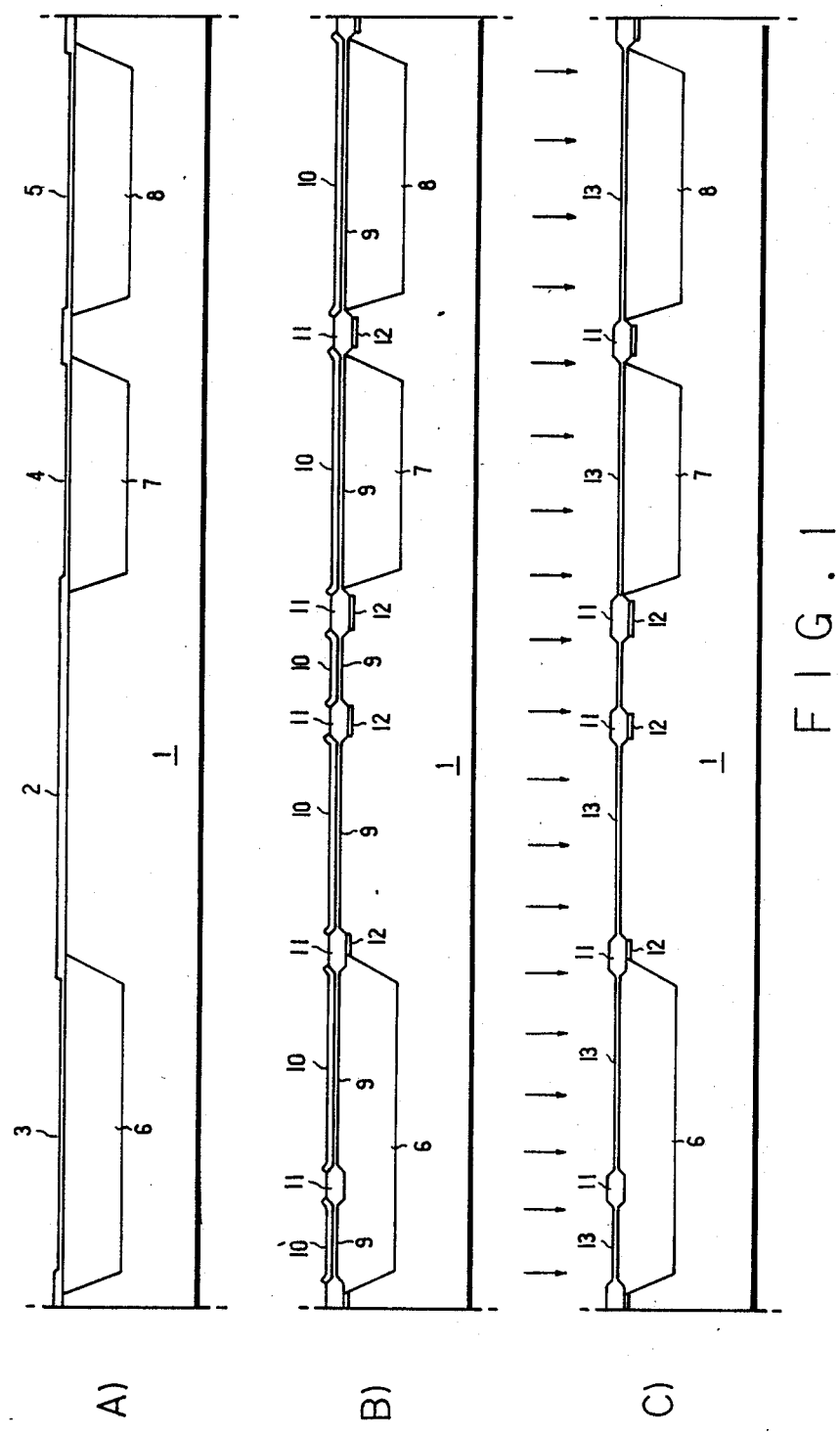
Figure 1:
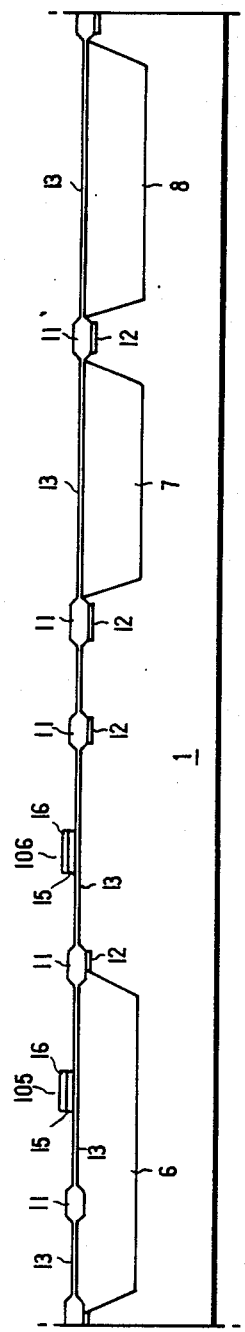
Figure 1:
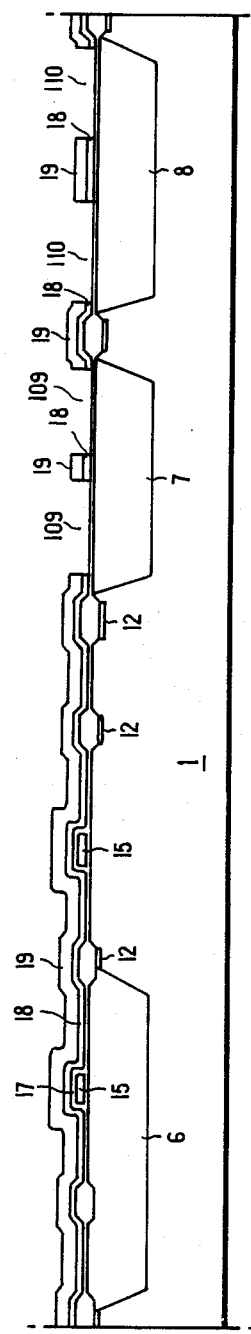
Figure 1:
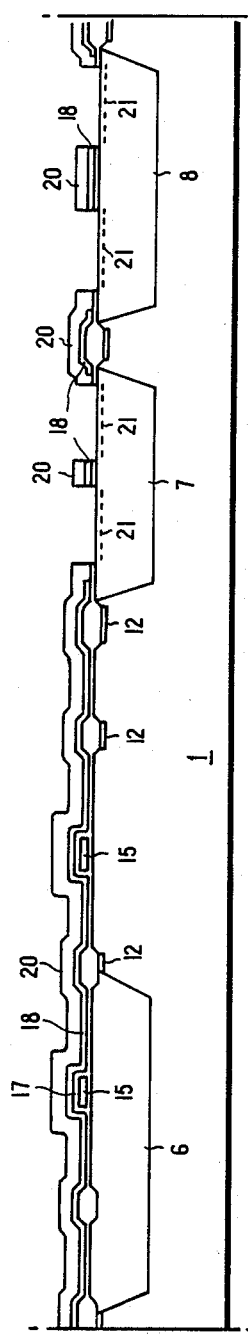
Figure 1:
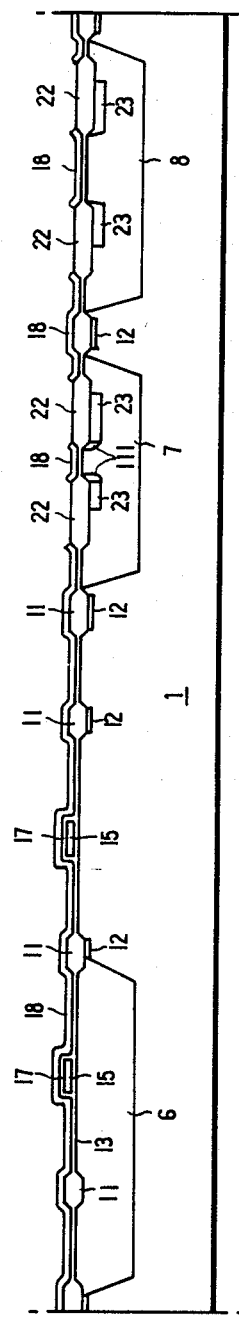
Figure 1:
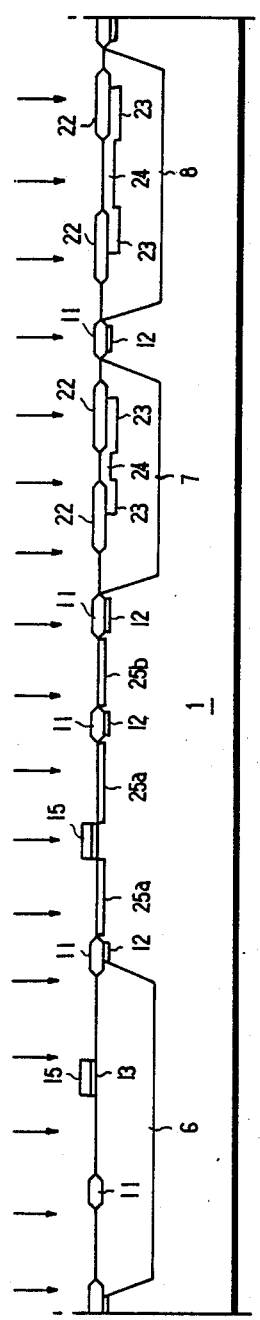
Figure 1:
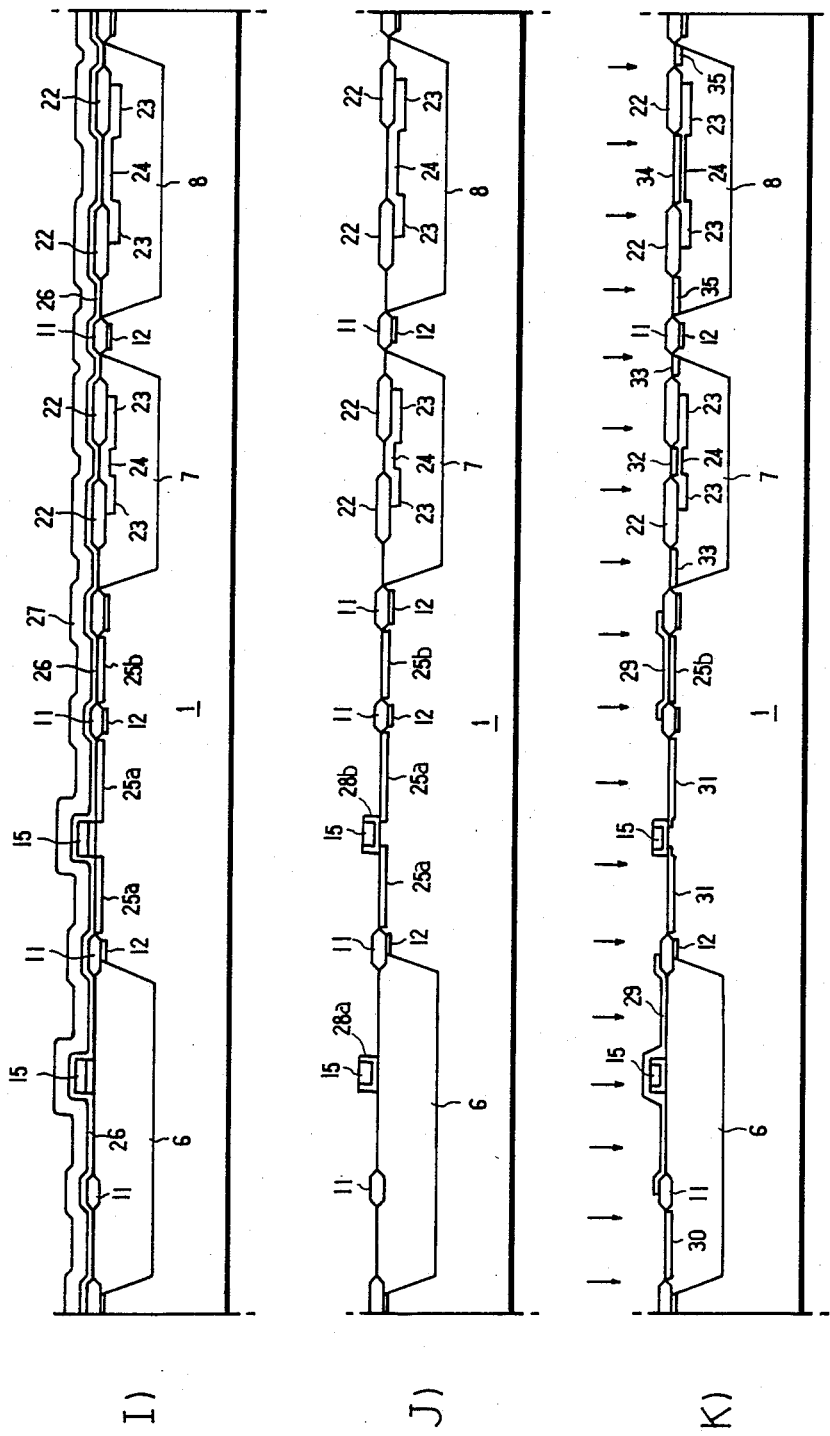
Figure 1:
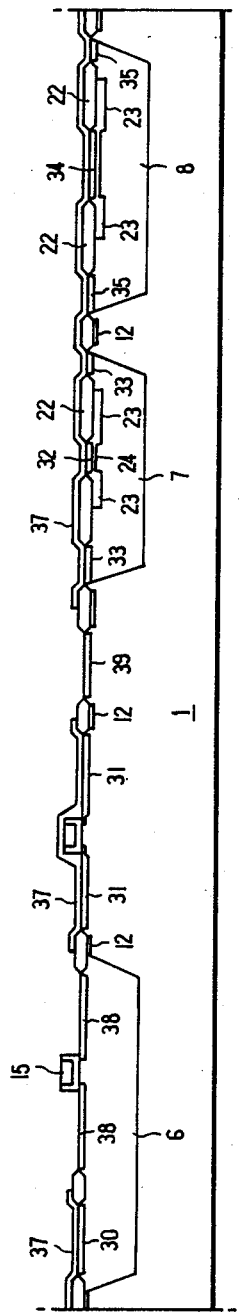
Figure 1:
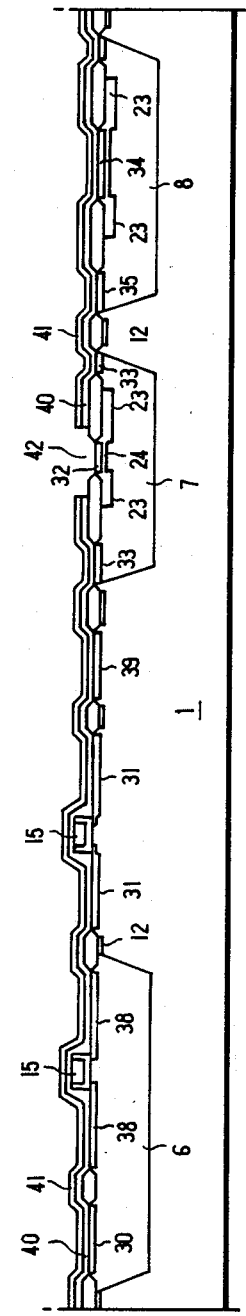
Figure 1:
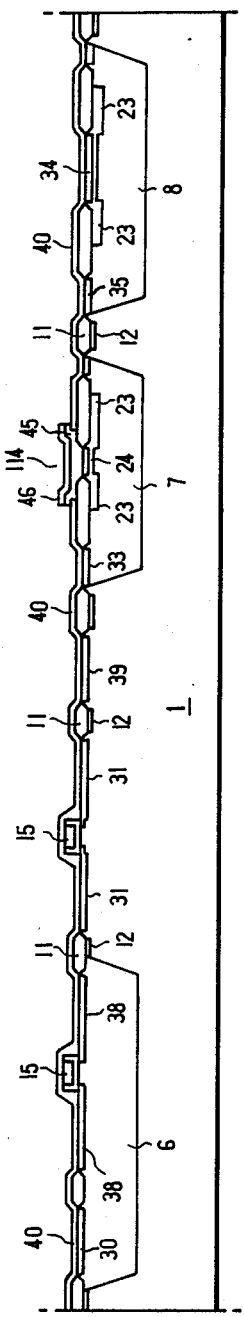
Figure 1:
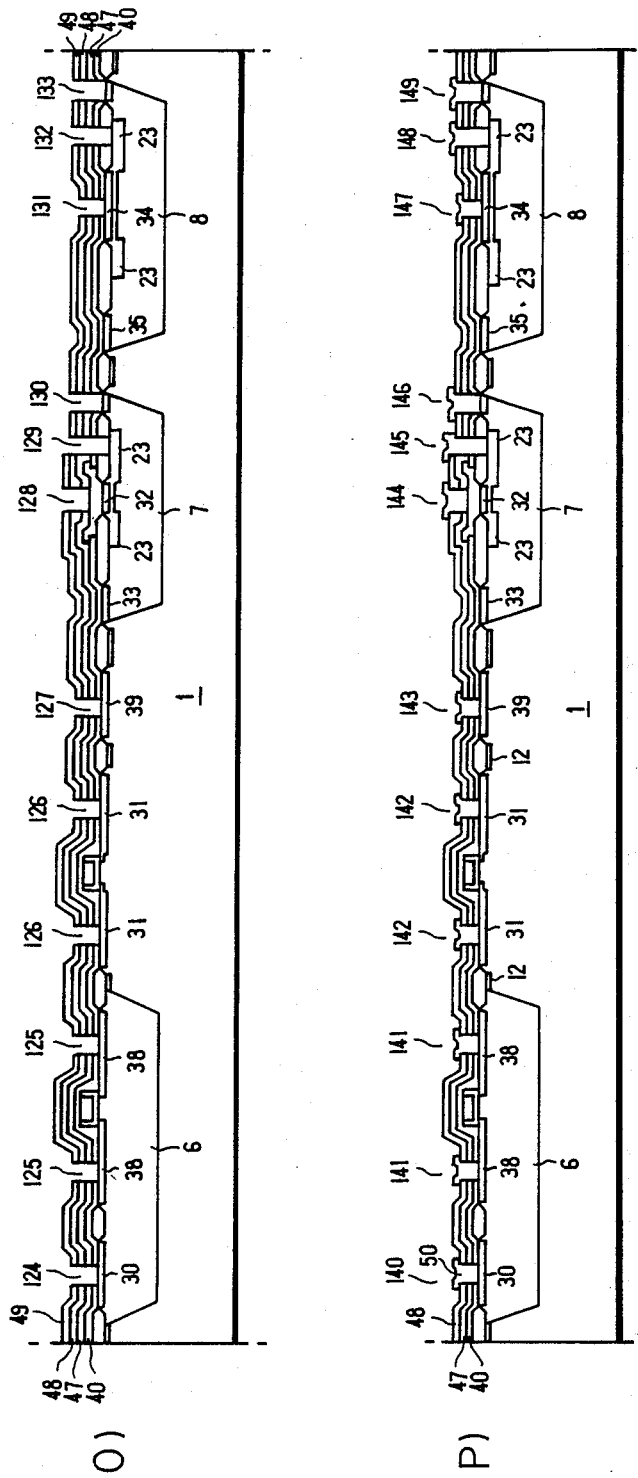
Figure 1:
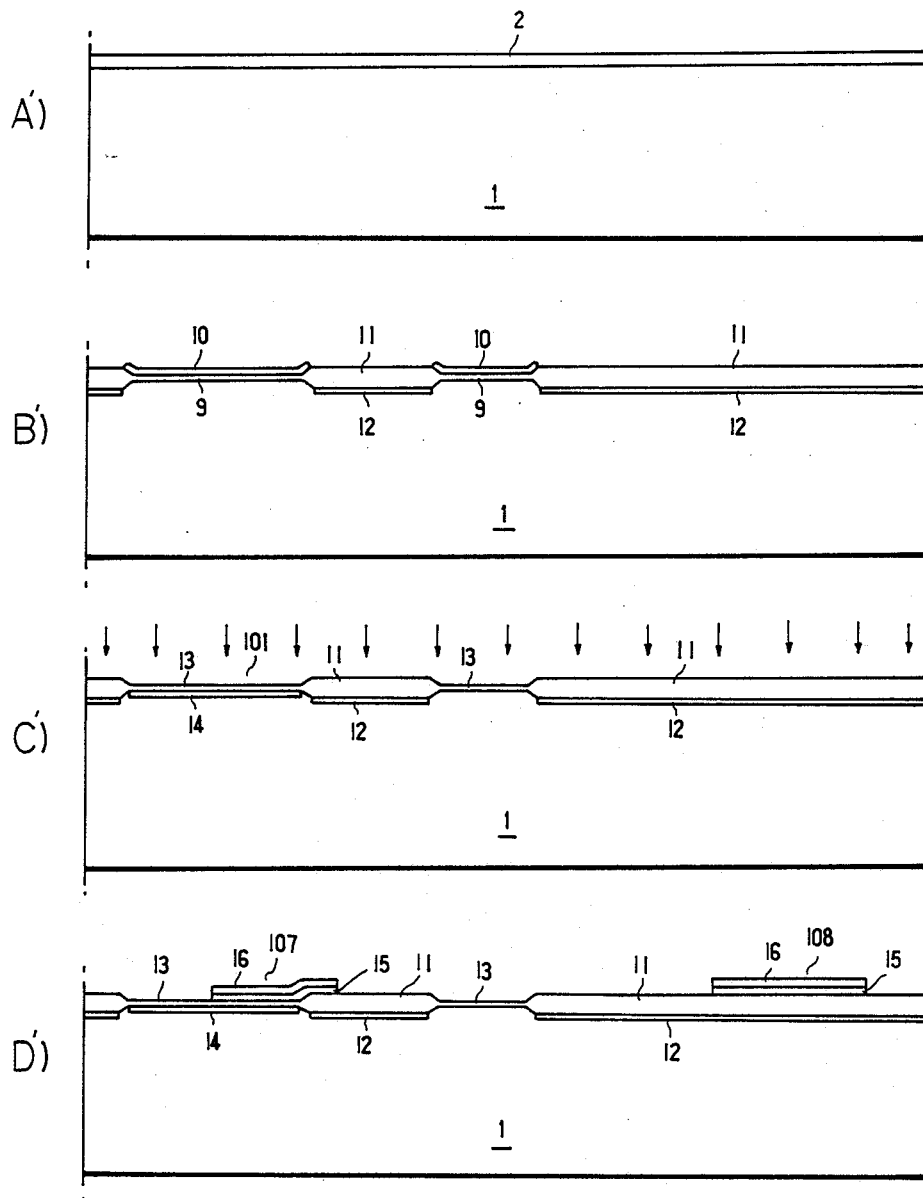
Figure 1:
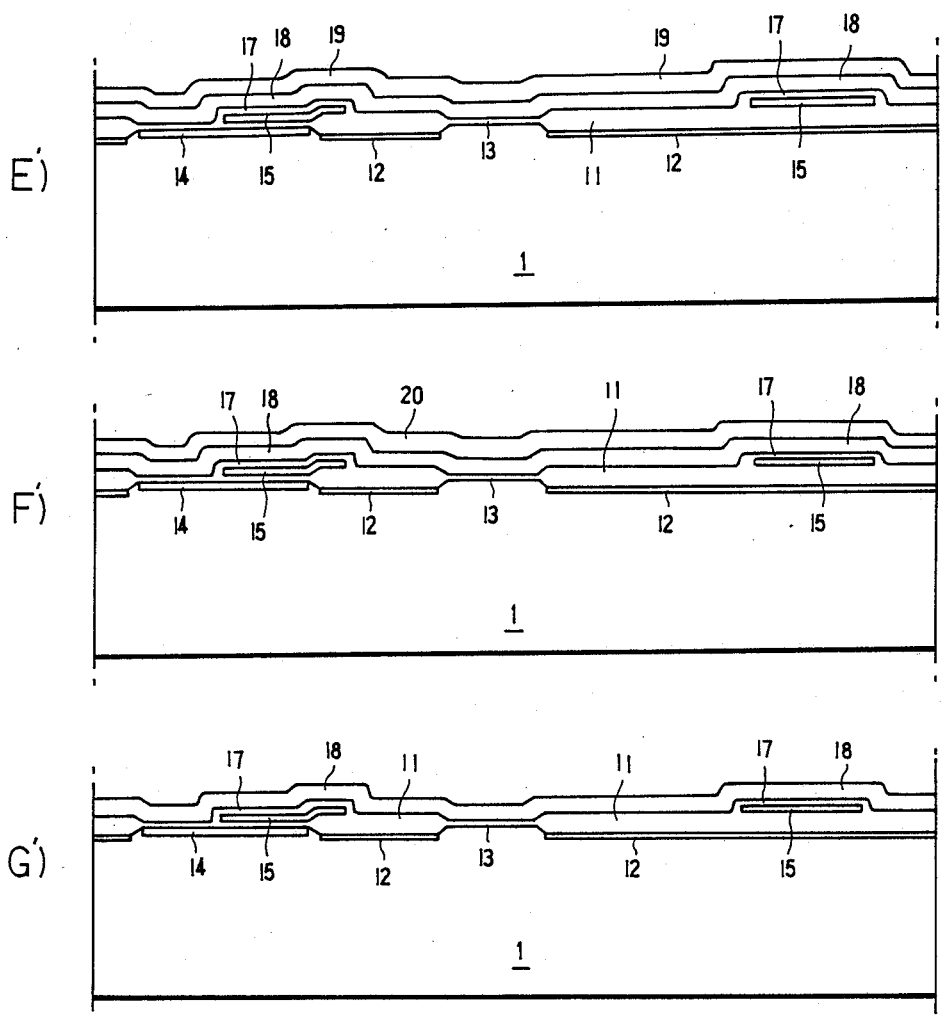
Figure 1:
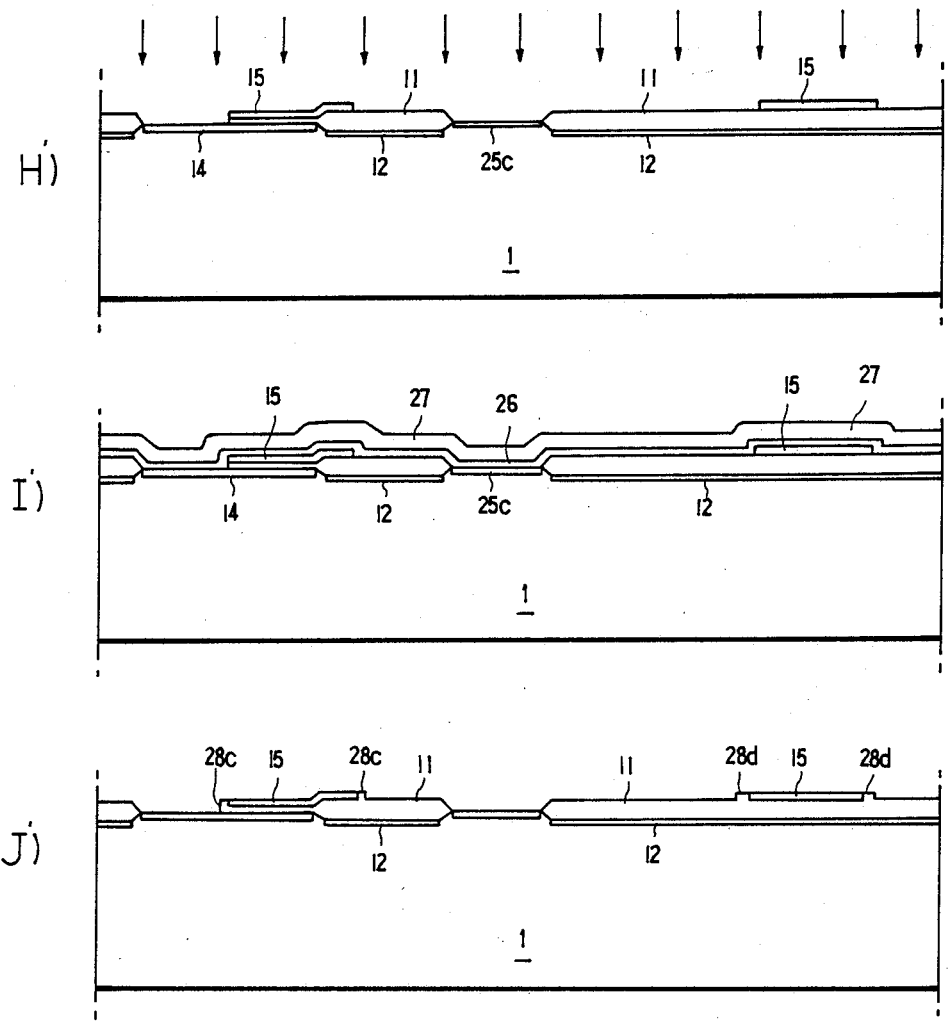
Figure 1:
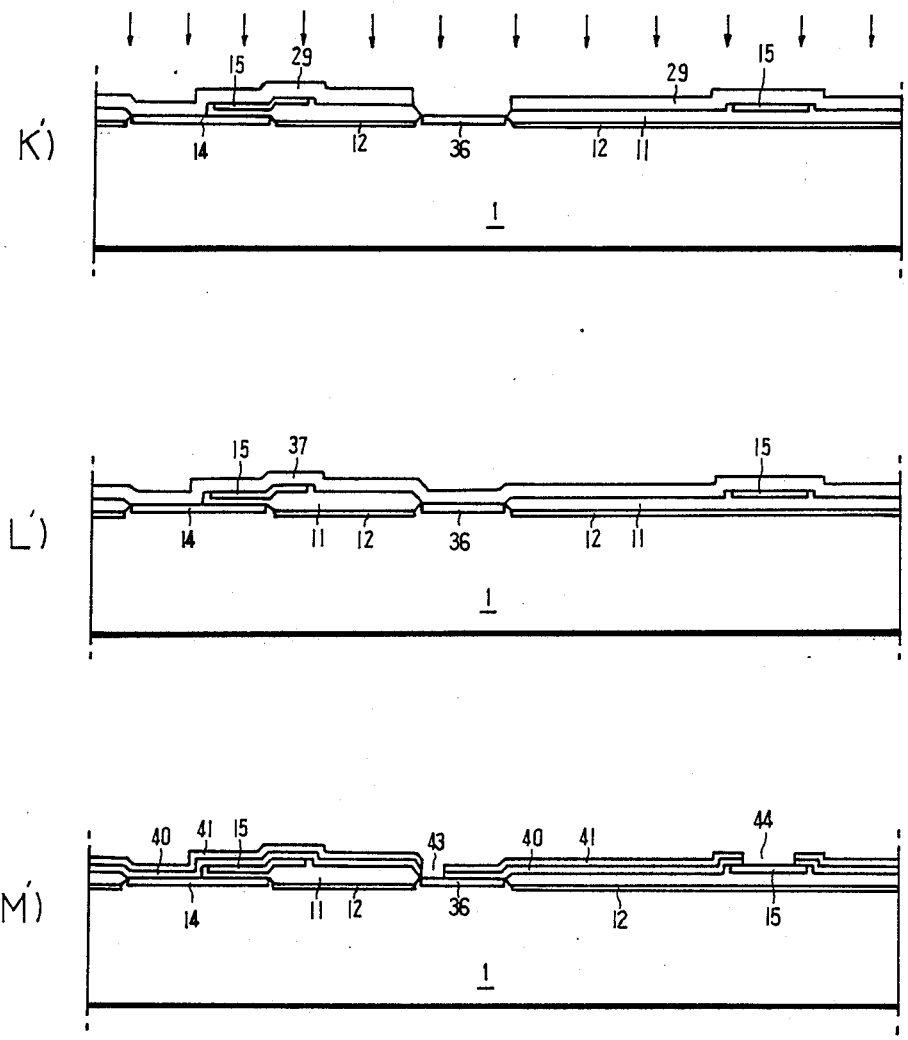
Figure 1:
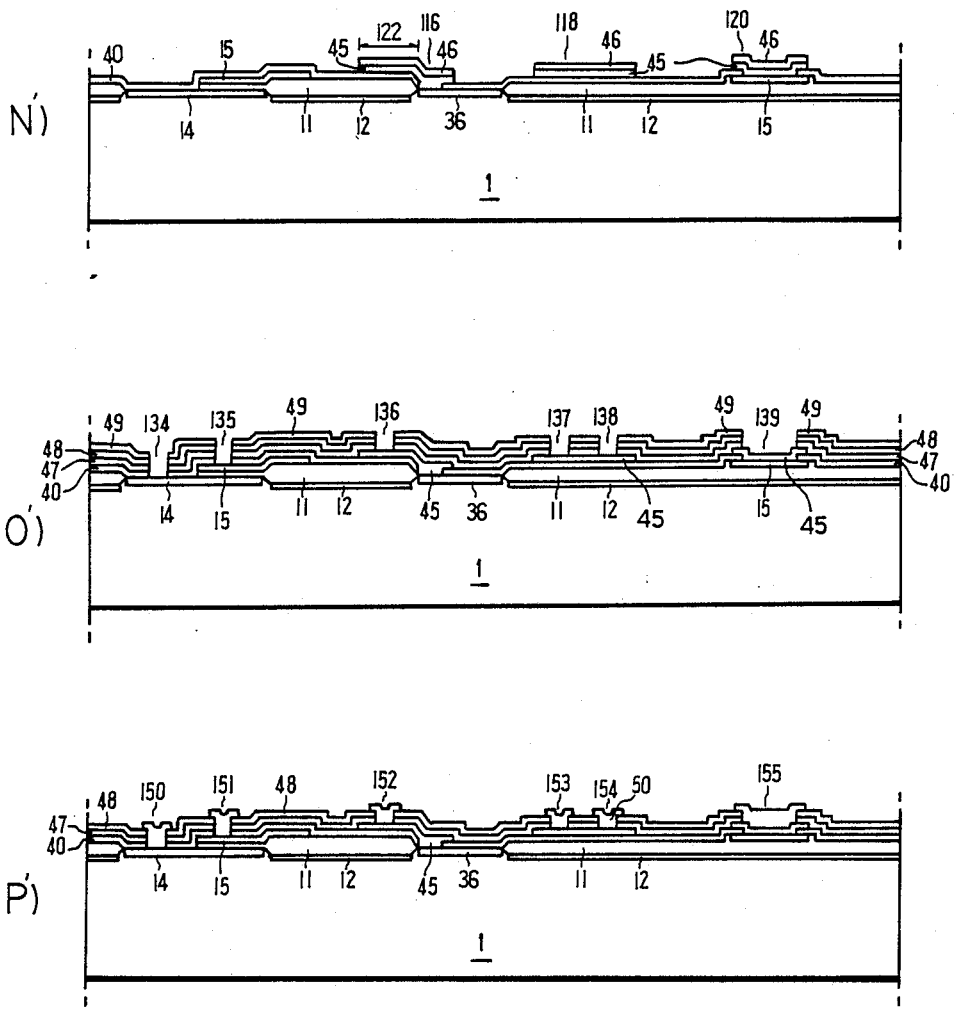

FIGS. 1(A)–(P) and 1(A')–(P') illustrate sequentially an embodiment of the method according to the present invention for fabricating a BiCMOS. The FIGS. 1(A)–(P) illustrate cross-sectional views for fabricating the active element portions of a BiCMOS which includes a PMOS transistor, NMOS transistor of LDD(Lightly Doped Drain) structure, self-aligned metal contact type bipolar transistor having high load driving force, high performance matching characteristic, high integration, and self-aligned polycrystalline silicon emitter type bipolar transistor having high speed characteristics in low current and high integration.

The influences, that the interface between the single crystal emitter region and the polycrystalline silicon region exerts to the element characteristic and the circuit characteristic, are depicted in pages 1346–1353, No.6, ED-34, IEEE published in June, 1987 and pages 47–48, Dig. Tech. Papers, VLSI Technology, Symp. published in May, 1986.

FIG. 1(A')–(P') illustrate other cross-sectional views for fabricating the passive element portions of a BiCMOS device having a capacitor, resistor region, the connecting region between the first polycrystalline silicon and the second polycrystalline silicon, etc. Hence, it will be noted that FIGS. 1(A)–(P) and 1(A')–(P') illustrate a single successive method carried out on a single substrate. The starting material is P-type single crystal silicon substrate 1 whose crystal orientation and specific resistivity are respectively <100> and 2–20Ω-cm.

On the substrate 1 oxide thin film layer 2 is formed for masking, and thereafter, photoresist is deposited on the oxide layer 2. By means of conventional photolithography windows of the first, third and fourth regions of the substrate, the windows 3, 4, 5 are formed. The first region (or well) is to form a PMOS transistor, and the third and fourth regions (or collector regions) are respectively to form a polycrystalline silicon emitter type NPN transistor and a metal contact emitter NPN transistor. Through the the impurities of group V, such as phosphorus with an energy of about 160 KeV and a dose of $10^{12}$–$10^{14}$ ions/cm$^2$. Thereafter, the photoresist used as a mask during the ion implantation is removed, and under the atmosphere of oxygen and nitrogen at the temperature of 1000° C. to 1200° C., is activated and the implanted impurities diffused to form the first, third and fourth regions (6,7 8) of N-type having the depth of about 2.5 μm, as shown in FIG. 1(A).

Subsequently, the oxide layer 2 on the substrate 1 is all removed, and then, on the whole surface of the substrate is formed an oxide thin film layer 9 having a thickness of about 500 Å. On the upper surface of the oxide layer 9 is formed a nitride thin-film layer 10 of Si3N4 having the thickness of about 1500 Å by means of conventional low pressure CVD (Chemical Vapor Deposition). The masking layer consisting of the oxide layer 9 and the nitride layer 10 keeps the silicon surface of the substrate 1 below the masking layer from oxidizing in the subsequent oxidation method. The nitride layer of the region where an element-isolation oxide layer is formed is removed by conventional photolithography, and on the upper sides of the first, third and fourth regions an ion implantation mask of photoresist is formed. Thereafter, in order to establish an electrical isolation between elements, the impurities of group III, such as boron are implanted into the region rid of the nitride layer 10 except the first, third and fourth regions of the substrate with an energy of about 30 KeV and a dose of $10^{12}$ to $10^{14}$ ions/cm$^2$. Subsequently, the photoresist is removed, and by means of conventional heat treatment the element-isolation oxide layer 11, as shown FIGS. 1(B) and 1(B') is formed. During this oxidation method, the surface below the masking layer 9,10 of the silicon substrate is not oxidized, but the surface region not protected by the masking layer 9,10 of the silicon substrate is oxidized.

Further, the implanted ions of group III such as boron are activated to form a high concentration P-type channel stopper region 12 so as to prevent channel formation, as shown FIGS. 1(B) and 1(B'). After growing the element-isolation oxide layer 11, the nitride layer 10 is removed by using conventional nitride etching without any mask, and thereafter, the heat treating sacrificial oxidation method for substrate surface cleaning is carried out to form a sacrificial oxide layer having a thickness of about 550 Å. Then, in order to form the passive element of a MOS capacitor, a photoresist is deposited on the substrate region except for the MOS capacitor, region 101, and the impurities of group V such as arsenic are implanted with a dose of $10^{15}$ to $10^{16}$ ions/cm$^2$ by using the photoresist as an ion implantation mask, whereafter the photoresist is removed. By etching the sacrificial oxide layer on the substrate surface without using any mask, the element-isolation oxide layer 11 is reduced by the thickness of the sacrificial oxide layer, and the substrate surface not forming the element-isolation oxide layer 11 is exposed. On the exposed substrate surface an oxide layer 13 having the thickness of 200 to 500 Å is formed in order to form the gate insulating layer of the MOS transistor and the dielectric layer of the capacitor by means of conventional heat treating oxidation, as shown FIGS. 1(C) and 1(C'). In this case, the ions of group V, such as arsenic implanted into the MOS capacitor region, is activated to form MOS capacitor electrode region 14. Into the whole surface of the silicon substrate the impurities of group III such as boron with a low energy of about 30 KeV and a dose of $10^{11}$–$10^{13}$ ions/cm$^2$ are implanted in order to adjust the threshold voltages of the NMOS transistor and PMOS transistor to about 0.8 Volt, as shown in FIG. 1(C) and 1(C'). Being used as the gate electrode material of the MOS transistors, connecting element material and the electrode plate material having a certain area on the dielectric layer of the capacitor, the first polycrystalline silicon layer 15 having the thickness of about 4000 Å is formed on the whole surface of the substrate by conventional low pressure CVD, and thereafter, the impurities of group V such as phosphorus are caused to penetrate the silicon layer 15 to reduce the resistance thereof.

For example, using POCl3 at the temperature of 900° C. gives the first polycrystalline silicon a resistance of about 20Ω/□. Thereafter, as shown in FIGS. 1(D) and 1(D'), in order to form polycrystalline silicon region 105 for the gate of the PMOS transistor, polycrystalline silicon region 106 for the gate of the NMOS transistor, polycrystalline silicon region 107 for the upper electrode of the capacitor dielectric layer, and a polycrystalline silicon regions for connecting elements, i.e., first polycrystalline silicon region 108 for connecting with second polycrystalline silicon in the subsequent step, photoresist 16 is deposited on the above regions, and first polycrystalline silicon in the remaining regions is removed by conventional etching, whereafter the photoresist 16 is removed.

Then, as shown in FIGS. 1(E) and 1(E') a, conventional heat treating oxidation method is carried out at the temperature of about 900° C. to form an oxide layer 17 having the thickness of about 500 Å on the substrate, on which a nitride layer 18 having the thickness of about 1000 Å is formed by conventional low pressure CVD. It will be noted that the oxide layer 13 becomes thick by the oxide layer 17 growing on the first polycrystalline silicon layer 15 in the heat oxidation method. The masking layer formed by the oxide layer 17 and the nitride layer 18 serves as a mask for the subsequent method for forming the base of NPN transistors so that the impurities of group III such as boron are selectively implanted, and in the subsequent oxidation method keep the silicon of the substrate surface below the masking layer from oxidizing. On the upper surface of the masking layer 17,18 except for the regions 109,110 for forming the inactive base of the NPN transistor a mask of photoresist 19 is formed, and the exposed nitride layer (18) not masked is removed. Thereafter, the photoresist 19 is removed. Then, as shown in FIGS. 1(F) and 1(F'), for the base forming of the NPN transistor a mask 20 of photoresist is formed, and the exposed oxide layer 17 is etched, thereafter the impurities of group III such as boron are implanted with an energy of about 35 KeV and a dose of $1 \times 10^{14}$ to $5 \times 10^{14}$ ions/cm$^2$. Subsequently, by conventional method photoresist 20 is removed, and by using the nitride layer 18 as an anti-oxidation mask the oxidation method is carried, thereby resulting in an oxide layer 22 having the thickness of 2000 to 3000 Å formed on the silicon surface exposed by the etching, as shown in FIGS. 1(G) and 1(G'). When the impurities 21 of group III such as boron implanted into the inactive base region are simultaneously activated to diffuse horizontally and vertically, the inactive base region 23 is formed.

This horizontal diffusion serves as link-up region III of relatively low concentration to be connected with the subsequently formed active base region. By conventional nitride layer etching the nitride layer 18 is removed, the oxide layer 13 below the nitride layer and the thin oxide layer 17 on the upper surface of the first polycrystalline silicon is etched, after which a mask of photoresist, for forming the active base of the NPN transistor is formed, and the impurities of group III such as boron are implanted with an energy of 50 KeV and a dose of $3 \times 10^{13}$ ions/cm$^2$ to form the active base region 24 of low concentration of the NPN transistor formed on the upper surfaces of the third and fourth regions. In this case, after the nitride layer and oxide layer of the NPN transistor region is removed, the ion implantation is carried out. However, it will be easily understood that without etching the nitride and oxide layer, the impurities of group III, such as boron with a high energy to pass those insulating layers so as to form the active base region, can be implanted.

Then, after removing the above photoresist into the whole surface of the substrate, the impurities of group V such as phosphorus with an energy of 30 KeV and a dose of $10^{12}$–$10^{13}$ ions/cm$^2$ to form the source and drain region 25a of low concentration doped drain (LDD) type NMOS transistor and low concentration n-type region 25b, 25c, are implanted as shown in FIGS. 1(H) and 1(H'). Thereafter, the conventional heat treating oxidation method is carried out at the temperature of about 900° C. to form an oxide layer 26 having the thickness of about 500SÅ, and on the whole surface of the silicon substrate, as shown in FIG. 1(I) and 1(I'), an oxide layer 27 by conventional CVD is formed. Subsequently, the oxide layer 26 and CVD oxide layer 27 are etched by conventional dry etching to form oxide layer spacers 28a, 28b, 28c, 28d on the sidewalls of the first polycrystalline silicon, as shown in FIGS. 1(J) and 1(J'). The oxide layer spaces 28b of the gate sidewalls of the second region NMOS transistor among the above oxide layer spacers 28a, 28b, 28c, 28d can cause a NMOS transistor of the LDD structure to be formed.

Then, as shown in FIGS. 1(K) and 1(K'), on the upper surface of the silicon substrate, photoresist 29, and the impurities of group V such as arsenic are implanted with an energy of about 40–80 KeV and a dose of $10^{14}$ to $10^{16}$ ions/cm$^2$ is formed so as to form the connecting region 30 for the first region of PMOS transistor, the high concentration source and drain region 31 of NMOS transistor, the emitter region 32 of the polycrystalline silicon emitter NPN transistor and the collector connecting region 33 of the third region, the emitter region 34 of the metal contact emitter NPN transistor and the collector connecting region 35 of the fourth region, and the lower region 36 of resistor. Thereafter, the photoresist 29 is removed. Photoresist 37 is formed on the upper surface of the substrate as shown in FIGS. 1(L) and 1(L'), and the impurities of group III, such as boron are implanted with a low energy of about 30 KeV and a dose of $10^{15}$ to $10^{16}$ ions/cm², so as to form the source and drain region 38 of the PMOS transistor, and the connecting region 39 for the second region of the NMOS transistor, after which the photoresist 37 is removed. On the whole surface of the silicon substrate, an oxide layer 40 by conventional CVD is formed, as shown in FIGS. 1(M) and 1(M'). On the whole surfaces of the oxide layer 40, photoresist 41 is deposited, and by conventional photolithography the emitter region 42 of polycrystalline silicon emitter NPN transistor and the butting contact 43 of resistor portion thereof, and the contact portion 44 of the first polycrystalline silicon and the second polycrystalline silicon are formed. In this case, by adjusting the etching time an over etch by about 20% is made. The CVD oxide layer has an etching speed higher than that of the thermally grown oxide layer, which helps the etching adjustment.

After removing the photoresist 41, the texture of the CVD oxide layer is densified by conventional heat treatment. Polycrystalline silicon is used as the emitter electrode material polycrystalline silicon is used as the resistor of the passive element, and for the connecting material, a second polycrystalline silicon layer 45 is formed on the whole surface of the silicon substrate by conventional method.

As shown in FIGS. 1(N) and 1(N'), in order to only preserve the polycrystalline layers of the polycrystalline silicon region 114 of polycrystalline silicon emitter NPN transistor, second polycrystalline silicon region 116 of the butting contact region and the resistor element region of the order of $G\Omega/\square$, several hundreds $\Omega/\square$ resistor element region 118 employing second polycrystalline silicon layer, and second polycrystalline silicon portion 120 for connecting with first polycrystalline silicon, photoresist 46 is deposited, and the polycrystalline layer is removed by conventional etching method, after which the photoresist 46 is removed by conventional method.

In order to selectively adjust the magnitude of the electrical property of the passive element made of polycrystalline material, photoresist is formed to make a masking so as to protect the resistor region 122 of the order of $G\Omega/\square$, and the impurities of group V, such as arsenic are implanted with a suitable dose so as to give the polycrystalline silicon emitter region a surface resistivity of several hundreds $\Omega/\square$, after which the photoresist is removed by conventional method. Then, on the whole surface of the silicon substrate, a conventional CVD oxide layer 47 and a conventional PSG layer 48 are formed, which is thermally treated so as to activate the impurities implanted into said regions 30,31,32,33,34,35,38 and 39 to cohere the oxide layer 47, and to smooth the silicon surface.

As shown in FIGS. (O) and (O'), on the whole surface of the substrate photoresist 49 is formed and by conventional photolithography, connecting region window 124 and source and drain region window 125 of PMOS transistor, source and drain region window 126 of NMOS transistor, the second region connecting window 127 of NMOS transistor, the base connecting region window 129, emitter connecting region window 128 and collector connecting region window 130 of polycrystalline silicon emitter bipolar NPN transistor, and the emitter connecting region window 131, base connecting region window 132 and collector connecting region window 133 of metal contact emitter NPN transistor, capacitor electrode region window 134,135, resistor region window 136, 137,138, and the connecting region window 139 of first polycrystalline silicon are formed and second polycrystalline silicon. After removing the photoresist 49, metal layer 50 is formed by using conventional vacuum deposition, and then photoresist is deposited. As shown in FIGS. 1(P) and 1(P'), etching the metal layer 50 gives the first region focusing electrode 140, source and drain electrode 141 of PMOS transistor, source and drain electrode 142 and the second region focusing electrode 143 of NMOS transistor, emitter electrode 144 and base electrode 145 and the third region collector electrode 146 of polycrystalline silicon emitter NPN transistor, emitter electrode 147 and base electrode 148 and the fourth region collector electrode 149 of metal contact emitter NPN transistor, MOS capacitor electrodes 150,151, electrodes 152,153,154 of resistor region of the order of $G\Omega/\square$ and several hundreds $\Omega/\square$, and contact region electrode 155 of first polycrystalline silicon and second polycrystalline silicon. Thereafter, the photoresist is removed by conventional method. After removing the photoresist on the electrodes, a protecting layer 51 (shown in FIGS. 2 and 3) is deposited to protect the semiconductor device.

Figure 2:
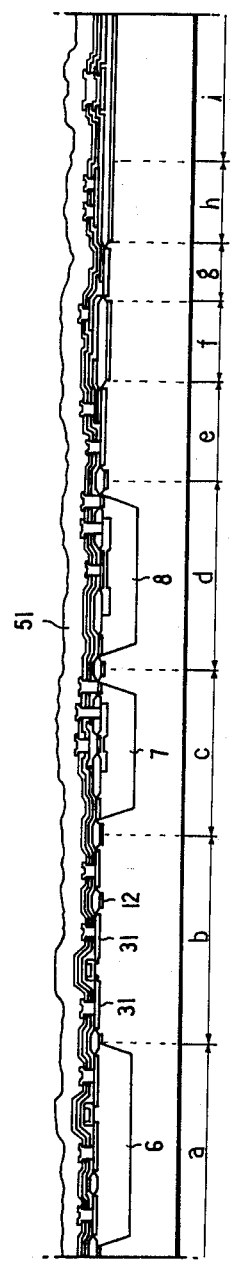
FIG. 2 is a cross-section of a semiconductor device produced by the method of the present invention.

FIG. 2 illustrates a cross-section of a BiCMOS device fabricated through the above method, wherein the region a indicates PMOS transistor region, the region b NMOS transistor region of LDD structure, the region C polycrystalline silicon emitter NPN, transistor region having self-aligned structure, the region d of metal contact emitter NPN transistor region having self-aligned structure, the region e MOS capacitor region, the region f polycrystalline silicon resistor region having a high resistivity of the order of $G\Omega/\square$, the region g butting contact region, the region h polycrystalline silicon resistor region having the resistivity of the order of several hundreds $\Omega/\square$, and the region i the contact region connecting first polycrystalline silicon layer and second polycrystalline silicon layer.

Figure 3:
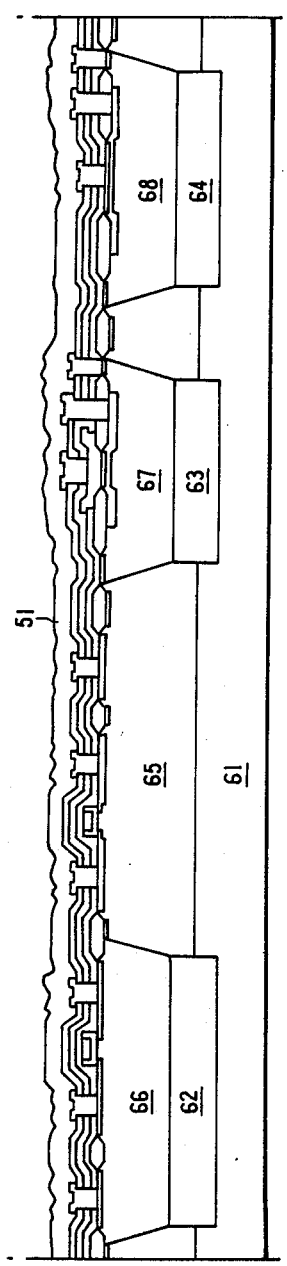
FIG. 3 is a cross-section of the active element portion produced by another embodiment of the present invention.

FIG. 3 illustrates a cross-section of the active element portion produced by another embodiment of the present invention. Although in the embodiment of FIG. 1(A)-(P) the present invention is explained based on the triple diffusion structure. The present invention is also suitable for forming a BiCMOS device of the standard bipolar transistor structure having a buried layer and an epitaxial layer, as shown in FIG. 3. The BiCMOS device, as shown in FIG. 3 include first conductivity-type single crystal silicon chip 61 of low concentration on which second conductivity-type buried layers 62,63,64 are formed, followed by first conductivity-type epitaxial layer 65 of high concentration. Then, the first region 66 forming the first MOS transistor having first conductivity-type channel, and the second and third regions 67,68 forming first and second bipolar transistors are formed in the buried layers 62,63,64 of second conductivity-type.

Here, successively carrying out the method as shown in FIG. 1(B)-(P), a BiCMOS device which includes a P-channel field effect transistor, N-channel field effect transistor, polycrystalline silicon emitter bipolar transistor, and metal contact emitter bipolar transistor is obtained. In fact, on a P-type single crystal silicon having the crystal orientation <100> and the resistivity of 0.006—0.1$\Omega$·cm, a high concentration N-type buried layer, a P-type epitaxial layer, and the N-type first region and third region are successively formed which is caused to undergo the method, as shown in FIG.

1(B)–(P), providing a BiCMOS device, as shown in FIG. 3.

Figure 4:
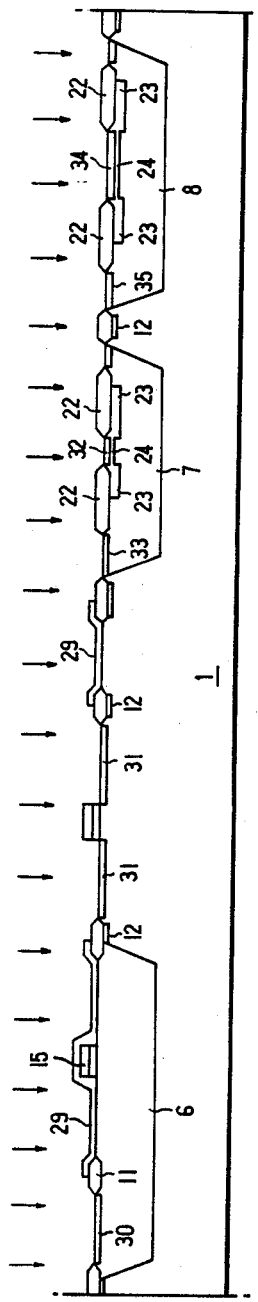
FIGS. 4(K)–(P) illustrate cross-sectionally another embodiment of the method according to the present invention.
Figure 4:
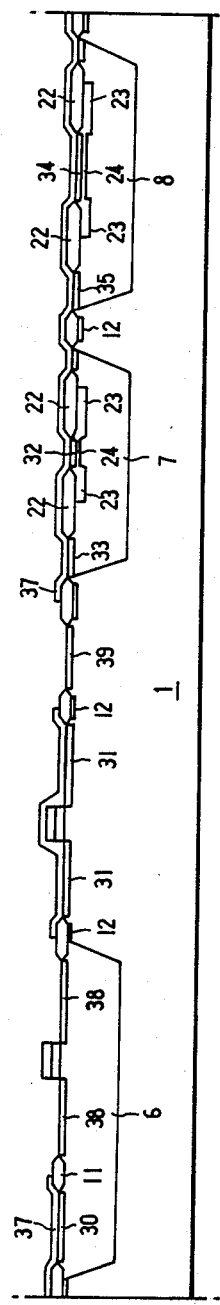
Figure 4:
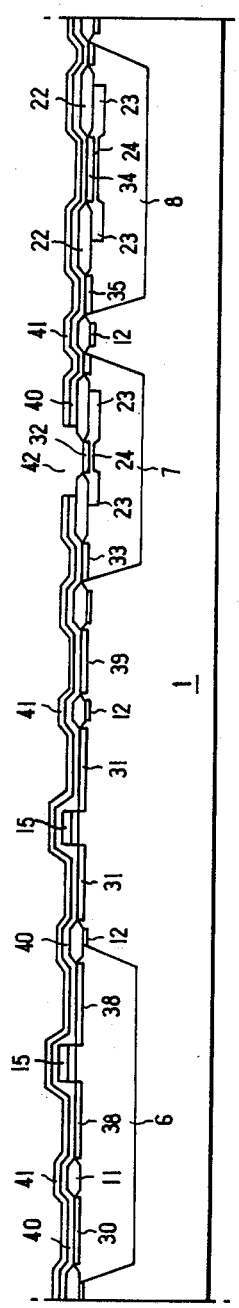
Figure 4:
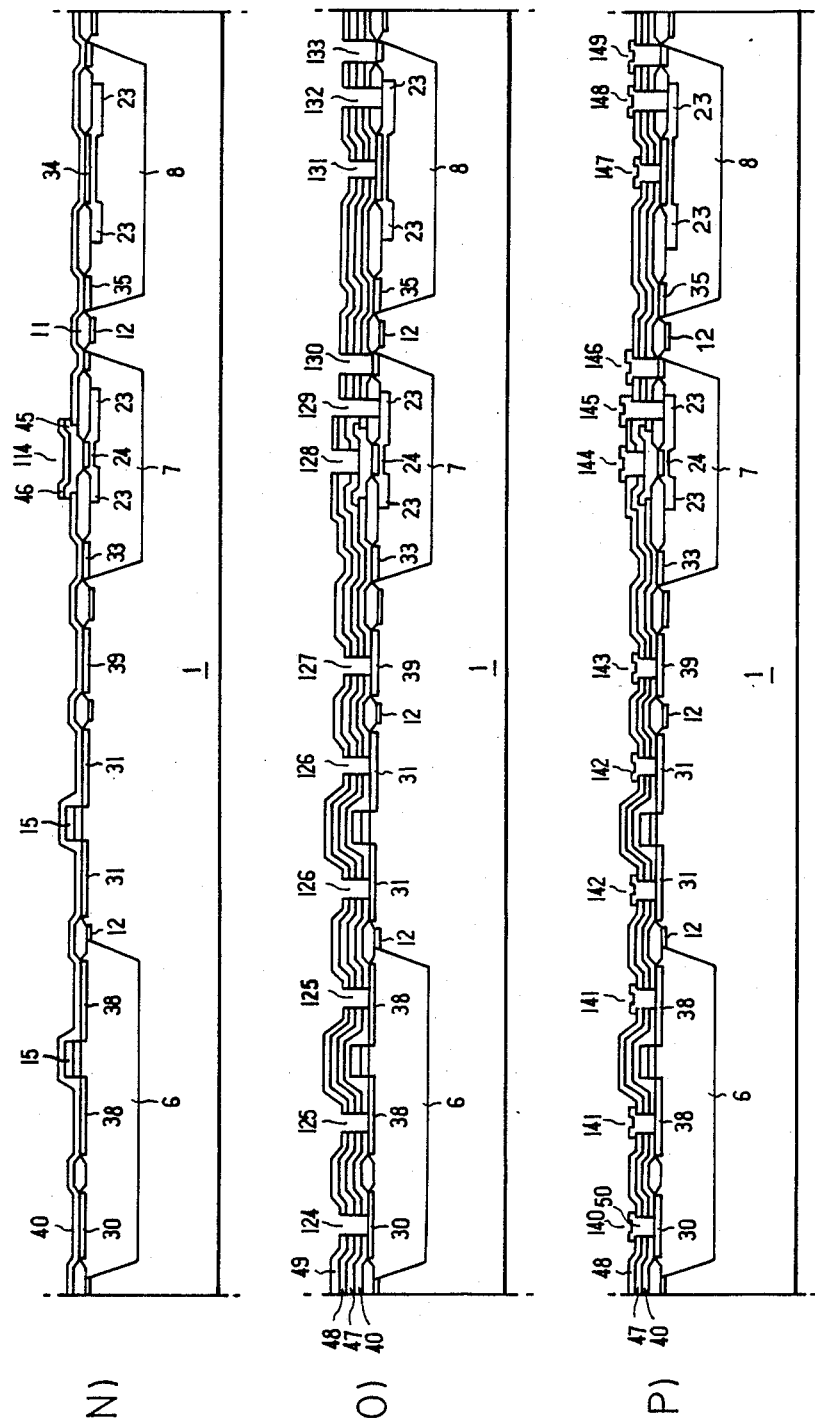

FIG. 4(K)–(P) illustrate cross-sectionally another embodiment of the method according to the present invention. On a P-type single crystal silicon chip, as shown in FIG. 1 or a low concentration P-type single crystal silicon chip, a high concentration P-type epitaxial layer is formed, and thereafter, is carried out the method as shown in FIG. 1(A) to 1(G). The nitride layer 18, the oxide layer 13 below the nitride layer, and the oxide layer 17 on the first polycrystalline silicon are removed so as to expose predetermined portions of the chip, on which a mask of photoresist is deposited for forming the active base region of the NPN transistors. Into the predetermined exposed portions of the chip the impurities of group III such as boron so as to form low concentration active base region 24 of the NPN transistor formed on the fourth region of the chip are implanted. Thereafter, the photoresist is removed. Subsequently, as shown in FIG. 4(K), on the upper surface of the silicon substrate, photoresist 29 is deposited and the inpurities of group V such as arsenic are implanted with an energy of about 40–80 KeV and a dose of $10^{14}$ to $10^{16}$ ions/cm$^2$ so as to form connecting region 30 of the first region of PMOS transistor, source and drain region 31 of the NMOS transistor, emitter region 32 and collector connecting region 33 of the third region of polycrystalline silicon emitter NPN transistor, and emitter region 34 and collector connecting region 35 of the fourth region of metal contact emitter NPN transistor. Thereafter, the photoresist is removed.

The method after FIG. 4(L) is the same as the method after FIG. 1(L), and the same reference numerals are used for the parts that the drawings of FIG. 4(K)–(P) have the same relations with FIG. 1(K)–(P). In FIG. 4(K)–(P) the active element of a BiCMOS transistor according to the present invention is shown and the passive element not shown may be formed by the same method as above, as shown in FIG. 1(K')–(P').

The method described as above, unlike the embodiment of FIGS. 2 and 3, provides a BiCMOS device having a conventional NMOS transistor instead of a NMOS transistor of LDD structure.

As described hereinbefore, the present invention embodies a high integration and high performance MOS transistor in a BiCMOS device, and provides a high precision bipolar transistor of high performance matching characteristic simultaneously with NMOS forming, which has an application in an analog circuit. Consequently, the present invention suitably integrates polycrystalline silicon emitter NPN transistors of small emitter area particularly suitable for high speed digital, metal contact emitter NPN transistors particularly suitable for high precision analog and high load drive, high quality MOS capacitor, biases for various circuits, polycrystalline silicon resistors for load, etc., and the interconnections between them, so that high performance logic circuits are obtained, high performance digital VLSI circuits data converters, analog VLSI circuits such as switched capacitor circuit, etc., which is impossible with the prior art. Further, the present invention can form self-aligned shallow base through a simple method, so that scaling down of element is easily carried out.

What is claimed is:

1. A method for fabricating a semiconductor device containing first and second MOSFETs and first and second bipolar transistors in a first conductivity-type silicon substrate, comprising the steps of:

(a) implanting second conductivity-type ions into predetermined regions of said substrate and activating the implanted said predetermined regions so as to form a first region for said first MOSFET, a third region for said first bipolar transistor, and a fourth region for said second bipolar transistor;

(b) forming element-isolation oxide thin film layers between elements of said transistors so as to isolate said elements from each other on said substrate, and forming first conductivity-type channel stopper regions below said oxide layers;

(c) forming a first oxide thin film layer for gates of said first and second MOSFETs on an upper surface of said substrate;

(d) forming said gates of said first and second MOSFETs by depositing and doping a first layer of polycrystalline semiconducting material over said first oxide thin film layer in said first region and a second region;

(e) depositing a nitride thin film layer for masking on a whole upper surface of said substrate and removing said nitride layer from predetermined portions of said substrate;

(f) etching said first oxide layer of predetermined portions of said third and fourth regions and implanting first conductivity-type ions into the etched portions so as to form inactive base regions of said first and second bipolar transistors;

(g) forming second oxide thin film layers on said third and fourth regions of said substrate by employing said nitride layer as a mask;

(h) implanting first conductivity-type ions into predetermined portions of said third and fourth regions of said substrate to form active base regions of said first and second bipolar transistors;

(i) implanting second conductivity-type ions to form low concentration drain and source regions of said second MOSFET;

(j) forming a third oxide thin-film layer on the whole surface of said substrate and etching said oxide layer without any separate mask so as to form oxide-layer spacers on sidewalls of the gates of said first and second MOSFETs;

(k) implanting second conductivity-type ions to form a substrate connecting region of said first MOSFET of said first region, a collector connecting region of said third and fourth regions, an emitter region of said second bipolar transistor, and high concentration drain and source regions of said second MOSFET;

(l) implanting first conductivity-type ions so as to form drain and source regions of said first MOSFET of said first region and a substrate connecting region of said second MOSFET of said second region;

(m) forming a fourth oxide thin film layer on the whole surface of said substrate and making an emitter connecting window of said first bipolar transistor;

(n) forming an emitter connecting portion of said first bipolar transistor with a second polycrystalline layer on the upper portion of said third region;

(o) making windows for connecting with the drain and source regions of said first and second MOSFETs, the emitter, base and collector region of said first and second bipolar transistors, and the substrate connecting regions of said first and second MOSFETs;

(p) making connections with a conduction layer through said windows; and (q) depositing a protecting layer on the whole surface of said substrate and then exposing a pad for wire-welding.

2. A method according to claim 1, comprising further steps of:

forming said element isolation oxide thin film layers between said elements and a capacitor region, and forming first conductivity-type channel stopper regions below said element-isolation oxide layers;

forming a lower electrode of a capacitor in said capacitor region;

forming an oxide thin film dielectric layer over the lower electrode of said capacitor simultaneously with the oxide thin film for the gates of said first and second MOSFETs;

forming the upper electrode of said capacitor over said capacitor dielectric layer simultaneously with said gates of said first and second MOSFETs;

making a connecting window of said capacitor region simultaneously with said connecting window of said capacitor electrode; and depositing said protecting layer over said capacitor region and then exposing a pad for wire-welding.

3. A method according to claim 1, comprising further steps of:

forming said element-isolation oxide thin film layers between said elements and substrate connecting region of a resistor region, and first conductivity-type channel stopper regions below said element-isolation oxide thin film layers;

forming an ion implantation region below the substrate connecting region of said resistor region simultaneously with the ion implantation of each of said element regions;

forming a connecting window for a butting contact of said resistor region together with the window for forming said emitter connecting region of said first bipolar transistor;

forming a high resistivity portion, butting contact portion and low resistivity portion of said resistor region while making the second polycrystalline layer emitter connecting portion of said first bipolar transistor;

implanting second conductivity-type ions into the low resistivity portion and butting contact portion of said resistivity region;

making a connecting window of said resistor region together with the connecting windows of each region;

making a connection with the conduction layer through the connecting window of said resistor region; and depositing a protecting layer and then exposing a pad for wire-welding.

4. A method according to claim 1, comprising further steps of:

forming said element-isolation oxide thin film layers between the regions of said transistors, a capacitor region and a substrate connecting portion of a resistor region, and first conductivity-type channel stopper regions below said element-isolation oxide layer;

forming a lower electrode of a capacitor in said capacitor region;

forming an oxide thin film dielectric layer over the lower electrode of said capacitor together with said oxide thin film for the gates of said first and second MOSFETs;

forming an upper electrode of said capacitor over the dielectric layer of said capacitor together with said gates of the first and second MOSFTETs;

forming an ion implantation region below the substrate connecting region of said resistor together with the ion implantation of each of said element regions;

making a connecting window for the butting contact of said resistor region together with the window for forming the emitter connecting region of said first bipolar transistor;

forming a high resistivity portion, butting contact portion and low resistivity portion of said resistor region together with said polycrystalline emitter connecting portion of said first bipolar transistor;

implanting second conductivity-type ions into the butting contact portion and low resistivity portion of said resistor region;

making connecting windows of said resistor regions and capacitor region together with the connecting window of each region i;

making a connection with the conducting layer through the connecting windows of said capacitor region and resistor region; and depositing a protecting layer and then exposing a pad for wire-welding.

5. A method for fabricating a semiconductor device containing first and second MOSFETs and first and second bipolar transistors in a first conductivity-type silicon substrate, comprising the steps of:

(a) implanting second conductivity-ions onto predetermined regions of said substrate and activating the ion-implanted regions so as to form a first region for said first MOSFET, a third region for said first bipolar transistor, and a fourth region for said second bipolar transistor;

(b) forming element-isolation oxide thin film layers between elements of said transistors to isolate said elements from each other on said substrate, and forming first conductivity-type channel stopper regions below said oxide layers;

(c) forming a first oxide thin film layer for gates of said first and second MOSFETs on an upper surface of said substrate;

(d) forming said gates of said first and second MOSFETs by depositing and doping a first layer of polycrystalline semiconducting material on said first oxide layer in said first and second regions;

(e) depositing a nitride thin film layer for masking on an upper surface of said substrate and removing said nitride layer to form predetermined portions of said third and fourth regions of said substrate;

(f) etching said first oxide layer of predetermined portions of said third and fourth regions and implanting first conductivity-type ions into the etched potions so as to form inactive base regions of said first and second bipolar transistors;

(g) forming second oxide thin film layers on said third and fourth regions of said substrate by employing said nitride layer as a mask;

(h) implanting first conductivity-type ions into predetermined portions of said third and fourth regions of said substrate so as to form active base regions of said first and second bipolar transistors;

(i) implanting second conductivity-type ions so as to form a substrate connecting region of said first MOSFET of said first region, a collector connecting region of said third and fourth regions, an emitter region of said second bipolar transistor, and drain and source regions of said second MOSFET;

(j) implanting first conductivity-type ions so as to form drain and source regions of said first MOSFET of said first region and a substrate connecting region of said second MOSFET of said second region;

(k) forming a third oxide thin film layer on the whole surface of said substrate and making an emitter connecting window of said first bipolar transistor;

(l) forming an emitter connecting portion of said firms bipolar transistor with a second polycrystalline layer on the upper portion of said third region;

(m) making windows for connecting with the drain and source regions of said first and second MOSFETs, the emitter, base and collector regions of said first and second bipolar transistors, and the substrate connecting regions of said first and second MOSFETs;

(n) making connections with a conducting layer through said windows; and (o) depositing a protecting layer on the whole surface of said substrate and then exposing a pad for wire-welding.

6. A method according to claim 5, comprising further steps of:

forming said element-isolation oxide thin film layers between said elements and a capacitor a region, and forming first conductivity-type channel stopper regions below said element-isolation oxide layers;

forming a lower electrode of a capacitor in said capacitor region;

forming an oxide thin-film dielectric layer over the lower electrode of said capacitor simultaneously with the oxide thin film for the gates of said first and second MOSFETs;

forming the upper electrode of said capacitor over said capacitor dielectric layer simultaneously with said gates of said first and second MOSFETs;

making a connecting window of said capacitor region simultaneously with said connecting windows of each region;

making a connection with the conduction layer through the connecting window of said capacitor electrode; and depositing said protecting layer over said capacitor and then exposing a pad for wire-welding.

7. A method according to claim 5, comprising further steps of:

forming said element-isolation oxide thin film layers between said elements and substrate connecting region of a resistor region, and first conductivity-type channel stopper below said element-isolation oxide thin film layers;

forming an ion implantation region below the substrate connecting region of said resistor region simultaneously with the ion implantation of each of said element regions;

forming a connecting window for a butting contact of said resistor region together with the window for forming said emitter connecting region of said first bipolar transistor;

forming a high resistivity portion, butting contact portion and low resistivity portion of said resistor region together with the second polycrystalline layer emitter connecting portion of said first bipolar transistor;

implanting the second conductivity-type ions into the low resistivity portion and butting contact portion of said resistivity region;

making a connecting window of said resistor region together with the connecting windows of said region;

making a connection with the conduction layer through the connecting window of said resistor region; and depositing a protecting layer and then exposing a pad for wire-welding.

8. A method according to claim 5, comprising further steps of:

forming said element-isolation oxide thin film layers between the regions of said transistors, a capacitor and a substrate connecting portion of a resistor region, and first conductivity-type channel stopper regions below said element-isolation oxide layer;

forming a lower electrode of a capacitor in said capacitor region;

forming an oxide thin film dielectric layer over the lower electrode of said capacitor together with said oxide thin film for the gates of said first and second MOSFETs;

forming an upper electrode of said capacitor over the dielectric layer of said capacitor together with said gates of the first and second MOSFETs;

forming an ion implantation region below the substrate connecting region of said capacitor together with the ion implantation of each of said element regions;

making a connecting window for the butting contact of said resistor region together with the window for forming the emitter connecting region of said first bipolar transistor;

forming a high resistivity portion, butting contact portion and low resistivity portion of said resistor region together with said polycrystalline layer emitter connecting portion of said first bipolar transistor;

implanting second conductivity-type ions into the butting contact portion and low resistivity portion of said resistor region;

making connecting windows of said resistor regions and capacitor regions together with the connecting window of each region;

making a connection with the conduction layer through the connecting windows of said capacitor region and resistor region; and depositing a protecting layer and then exposing a pad for wire-welding.

9. A method for fabricating a semiconductor device containing first and second MOSFETs and first and second bipolar transistors in a first conductivity-type silicon substrate, comprising the steps of:

(a) implanting second conductivity-type ions into particular regions of said substrate and activating the implanted said regions so as to form a first region for a first MOSFET, a third region for a first bipolar transistor, and a fourth region for a second bipolar transistor;

(b) forming element-isolation oxide thin film layers between elements of said first MOSFET, first bipolar and second bipolar transistors to isolate said elements from each other on said substrate, and forming a first conductivity-type channel stopper region below said oxide layers;

(c) forming a first oxide thin film layer for gates of said first and second MOSFETs on an upper surface of said substrate;

(d) forming said gates of said first and second MOSFETs by depositing and doping a first layer of polycrystalline semiconducting material over said first oxide thin film layer in said first region and a second region;

(e) depositing a nitride thin film layer for masking on a whole upper surface of said substrate and removing said nitride layer from selected portions of said third and fourth regions of said substrate;

(f) etching said first oxide layer of selected portions of said third and fourth regions and implanting first conductivity-type ions into the etched portions to form inactive base regions of said first and second bipolar transistors;

(g) forming second oxide thin film layers on said third and fourth regions of said substrate by employing said nitride layer as a mask;

(h) implanting first conductivity-type ions into selected portions of said third and fourth regions of said substrate to form active base regions of said first and second bipolar transistors;

(i) implanting second conductivity-type ions to form low concentration drain and source regions of said second MOSFET;

(j) forming a third thin oxide thin-film layer on the whole surface of said substrate and etching said oxide layer without any separate mask so as to form oxide-layer spacers on sidewalls of the gate regions of said first and second MOSFETs;

(k) implanting second conductivity-type ions to form a substrate connecting region of said first MOSFET of said first region, a collector connecting region of said third and fourth regions, an emitter region of said second bipolar transistor, and high concentration drain and source regions of said second MOSFET;

(l) implanting first conductivity-type ions so as to form drain and source regions of said first MOSFET of said first region and a substrate connecting region of said second MOSFET of said second region;

(m) forming a fourth oxide thin film layer on the whole surface of said substrate and making an emitter connecting window of said first bipolar transistor;

(n) forming an emitter connecting portion of said first bipolar transistor with a second polycrystalline layer on the upper portion of said third region; and (o) making windows for connecting with the drain and source regions of said first and second MOSFETs, the emitter, base and collector region of said first and second bipolar transistors, and the substrate connecting regions of said first and second MOSFETs.

10. A method according to claim 9, comprising further steps of:

forming said element isolation oxide thin film layers between said elements and a capacitor region, and first conductivity-type channel stopper regions below said element-isolation oxide layers;

forming an oxide thin film dielectric layer over the lower electrode of said capacitor simultaneously with the oxide thin film for the gates of said first and second MOSFETs step;

forming an upper electrode of said capacitor director simultaneously with the oxide thin film for the gates of said first and second MOSFETs;

making a connecting window of said capacitor region simultaneously with said connecting windows of said regions said step; and making a connection with a conduction layer through the connecting window of said capacitor electrode.

11. A method according to claim 9, comprising further steps of:

forming said element-isolation oxide thin film layers between said elements and a region to form a substrate connection of a resistor region, and first conductivity-type channel stopper regions below said element-isolation oxide thin film layer, forming an ion implantation region below the substrate connection of said resistor region simultaneously with ion implantation of each of said element regions;

forming a connecting window for a butting contact of said resistor region together with the window for forming said emitter connecting region of said first bipolar transistor;

forming a high resistivity portion, butting contact portion and low resistivity portion of said resistor region together with the second polycrystalline emitter connecting portion of said first bipolar transistor;

implanting second conductivity-type ions into the low resistivity portion and butting contact portion of said resistivity region;

making a connecting window of said resistor region together with the connecting windows of each region; and making a connection with a conduction layer through the connecting window of said resistor region.

12. A method according to claim 9, comprising further steps of:

forming said element-isolation oxide thin film layers between the elements, a capacitor portion and a substrate connecting portion of a resistor region, and first conductivity-type channel stopper regions below said element-isolation oxide layer;

forming a lower electrode of a capacitor in said capacitor region;

forming an oxide thin film dielectric layer over the lower electrode of said capacitor together with said oxide thin film for the gates of said first and second MOSFETs;

forming an upper electrode of said capacitor over the dielectric layer of said capacitor together with said gates of the first and second MOSFETs;

forming an ion implantation region below the substrate connecting region of said resistor together with the ion implantation of each of said element regions;

making a connecting window for a butting contact of said resistor region together with the window forming the emitter connecting region of said first bipolar transistor;

forming a high resistivity portion, butting contact portion and low resistivity portion of said resistor region together with said polycrystalline emitter connecting portion of said first bipolar transistor;

implanting second conductivity-type ions into the butting contact portion and low resistivity portion of said resistor region;

making connecting windows of said resistor regions and capacitor region together with the connecting window of each region; and making a connection with the conducting layer through the connecting windows.

13. A method first fabricating a semiconductor device containing first and second MOSFETs and first and second bipolar transistors in a first conductivity-type silicon substrate, comprising the steps of:

(a) implanting second conductivity-ions into particular regions of said substrate and activating the ion-implanted regions so as to form a first region for a first MOSFET, a third region for a first bipolar transistor, and a fourth region for a second bipolar transistor;

(b) forming element-isolation oxide thin film layers between elements of said first MOSFET, first bipolar and second bipolar transistor to isolate said elements from each other on said substrate, and forming first conductivity-type channel stopper regions below said oxide layers;

(c) forming a first oxide thin film layer for gates of said first and second MOSFETs on an upper surface of said substrate;

(d) forming said gates of said first and second MOSFETs by depositing and doping a first layer of polycrystalline semiconducting material over said first oxide layer in said first and second regions;

(e) depositing a nitride thin film layer for masking on the upper surface of said substrate and removing said nitride layer from selected portions of said third and fourth regions of said substrate;

(f) etching said first oxide layer of selected portions of said third and fourth regions and implanting first conductivity-type ions into the etched portions so as to form inactive base regions of said first and second bipolar transistors;

(g) forming second oxide thin film layers on said third and fourth regions of said substrate by employing said nitride layer as a mask;

(h) implanting first conductivity-type ions into selected portions of said third and fourth regions of said substrate so as to form active base regions of said first and second bipolar transistors;

(i) implanting second conductivity-type ions to form a substrate connecting region of said first MOSFET of said first region, a collector connecting region of said first MOSFET of said first region, a collector connecting region of said third and fourth regions, an emitter region of said second bipolar transistor, and drain and source regions of said second MOSFET;

(j) implanting first conductivity-type ions to form drain and source regions of said first MOSFET of said first region and a substrate connecting region of said second MOSFET of said second region;

(k) forming a third oxide thin film layer on the whole surface of said substrate and making an emitter connecting window of said first bipolar transistor;

(l) forming an emitter connecting portion of said first bipolar transistor with a second polycrystalline layer on the upper portion of said third region; and (m) making windows for connecting with the drain and source regions of said first and second MOSFETs, the emitter, base and collector regions of said first and second bipolar transistors, and the substrate connecting regions of said first and second 14. A method according to claim 13, comprising further steps of:

forming said element-isolation oxide thin film layers between said elements and a capacitor region, and first conductivity-type channel stopper regions below said element-isolation oxide layers;

forming a lower electrode of a capacitor in said capacitor region;

forming an oxide thin-film dielectric layer over the lower electrode of said capacitor simultaneously with the oxide thin film for the gates of said first and second MOSFETs;

forming an upper electrode of said capacitor over said capacitor dielectric layer simultaneously with said polycrystalline gates of said first and second MOSFETs;

making the connecting window of said capacitor region simultaneously with said connecting windows of each region; and making a connection with a conduction layer through the connecting window of said capacitor electrode.

15. A method according to claim 13, comprising further steps of:

forming said element-isolation oxide thin film layers between said elements and a region to form substrate connection of a resistor region, and first conductivity-type channel stopper regions below said element-isolation oxide thin film layers, forming an ion implantation region below the substrate connection region of said resistor region simultaneously with the ion implantation of each of said element regions;

forming a connecting window for a butting contact of said resistor region while making the window for forming said emitter connecting region of said first bipolar transistor;

forming a high resistivity portion, butting contact portion and low resistivity portion of said resistor region together with the polycrystalline emitter connecting portion of said first bipolar transistor;

implanting the second conductivity-type ions into the low resistivity portion and butting contact portion of said resistivity region;

making a connecting window of said resistor region together with the connecting windows of each region; and making a connection with a conduction layer through the connecting window of said resistor region.

16. A method according to claim 13, comprising further steps of:

forming said element-isolation oxide thin film layers between the elements of said transistors, a capacitor and a substrate connecting portion of a resistor region, and first conductivity-type channel stopper regions below said element-isolation oxide layer;

forming a lower electrode of a capacitor in said capacitor region;

forming an oxide thin layer film dielectric layer over the lower electrode of said capacitor together with said oxide thin film for the gates of said first and second MOSFETs;

forming an upper electrode of said capacitor over the dielectric layer of said capacitor together with said first and second MOSFETs;

forming an ion implantation region below the substrate connecting region of said capacitor together with the ion implantation of each of said element regions;

making a connecting window for a butting contact of said resistor region together with the window for forming the emitter connecting region of said first bipolar transistor;

forming a high resistivity portion, butting contact portion and low resistivity portion of said resistor region together with said polycrystalline emitter connecting portion of said first bipolar transistor;

implanting second conductivity-type ions into the butting contact portion and low resistivity portion of said resistor region;

making connecting windows of said resistor regions and capacitor regions together with the connecting window of each region; and making a connection with the conduction layer through the connecting windows.

17. A method for fabricating a semiconductor device containing first and second MOSFETs and a first bipolar transistor in a first conductivity-type silicon substrate, comprising the steps of:

(a) implanting second conductivity-type ions into particular regions of said substrate and activating the implanted said regions to form a first region for said first MOSFET, and a third region for said first bipolar transistor;

(b) forming element-isolation oxide thin film layers between elements of said first MOSFET and first bipolar transistor to isolate said elements from each other on said substrate, and forming a first conductivity-type channel stopper region below said oxide layers;

(c) forming a first oxide thin film layer for gates of said first MOSFET and a second MOSFET on an upper surface of said substrate;

(d) forming said gates of said first and second MOSFETs by depositing and doping a first layer of a polycrystalline semiconducting material over said first oxide thin film layer in said first region and a second region;

(e) depositing a nitride thin film layer for masking on a whole upper surface of said substrate and removing said nitride layer from selected portions of said third and fourth regions of said substrate;

(f) etching said first oxide layer of selected portions of said third and fourth regions and implanting first conductivity-type ions into the etched portions to form an inactive base region of said first bipolar transistor;

(g) forming second oxide thin film layers on said third region of said substrate by employing said nitride layer as a mask;

(h) implanting first conductivity-type ions into selected portions of said third region of said substrate to form an active base region of said first bipolar transistor;

(i) implanting second conductivity-type ions to form low concentration drain and source regions of said second MOSFET;

(j) forming a thin oxide thin-film layer on the whole surface of said substrate and etching said oxide layer without any separate mask to form oxide-layer spacers on sidewalls of the gate regions of said first and second MOSFETs;

(k) implanting second conductivity-type ions to form a substrate connecting region of said first MOSFET of said first region, a collector connecting region of said third region, high concentration drain and source regions of said second MOSFET, and a collector connecting region of said first bipolar transistor;

(l) implanting first conductivity-type ions to form drain and source regions of said first MOSFET of said first region;

(m) forming a fourth oxide thin film layer on the whole surface of said substrate and making an emitter connecting window of said first bipolar transistor;

(n) forming the emitter connecting portion of said first bipolar transistor with a second polycrystalline layer on the upper portion of said third region; and (o) making windows for connecting with the drain and source regions of said first and second MOSFETs, the emitter, base and collector region of said first bipolar transistor, and the substrate connecting regions of said first and second MOSFETs.

18. A method according to claim 17, comprising further steps of:

forming said element isolation oxide thin film layers between said elements and a capacitor region, and forming first conductivity-type channel stopper regions below said element-isolation oxide layers;

forming the lower electrode of a capacitor in said capacitor region;

forming an oxide thin film dielectric layer over the lower electrode of said capacitor simultaneously with the oxide thin film for the gates of said first and second MOSFETs;

forming an upper electrode of said capacitor over said capacitor dielectric layer simultaneously with said polycrystalline gates of said first and second MOSFETs;

making a connecting window of said capacitor region simultaneously with said connecting windows of each region; and making a connection with a conduction layer through the connecting window of said capacitor electrode.

19. A method according to claim 17, comprising further steps of:

forming said element-isolation oxide thin film layers between said elements and substrate connecting region of a resistor region, and first conductivity-type channel stopper region below said element-isolation oxide thin film layers;

forming an ion implantation region below the substrate connection of said resistor region simultaneously with the ion implantation of each of said element regions;

forming a connecting window for a butting contact of said resistor region together with the window for forming said emitter connecting region of said first bipolar transistor;

forming a high resistivity portion, butting contact portion and low resistivity portion of said resistor region together with the polycrystalline emitter connecting portion of said first bipolar transistor;

implanting second conductivity-type ions into the low resistivity portion and butting contact of said resistivity region;

making a connecting window of said resistor region together with the connecting windows of each region; and making a connection with a conduction layer through the connecting window of said resistor region.

20. A method according to claim 17, comprising further steps of:

forming said element-isolation oxide thin film layers between the regions of said transistors, a capacitor and a substrate connecting portion of a resistor region, and first conductivity-type channel stopper region below said element-isolation oxide layer;

forming a lower electrode of said capacitor in said capacitor region;

forming an oxide thin film dielectric layer over the lower electrode of said capacitor together with said oxide thin film for the gates of said first and second MOSFETs;

forming an upper electrode of said capacitor over the dielectric layer of said capacitor together with gates of said first and second MOSFETs;

forming an ion implantation region below the substrate connecting region of said resistor together with the ion implantation of each of said element regions;

making a connecting window for a butting contact of said resistor region together with the window forming the emitter connecting region of said first bipolar transistor;

forming a high resistivity portion, butting contact portion and low resistivity portion of said resistor region together with said polycrystalline emitter connecting portion of said first bipolar transistor;

implanting second conductivity-type ions into the butting contact portion and low resistivity portion of said resistor region;

making connecting windows of said resistor regions and capacitor region together with the connecting window of each region; and making a connection with the conducting layer through the connecting windows of said capacitor region.

21. A method for fabricating a semiconductor device containing first and second MOSFETs and a first bipolar transistor in a first conductivity-type silicon substrate, comprising the steps of:

(a) implanting second conductivity-ions into particular regions of said substrate and activating the ion-implanted regions to form a first region for a first MOSFET and a third region for a first bipolar transistor;

(b) forming element-isolation oxide thin film layers between elements of said first MOSFET and first bipolar transistor to isolate said elements from each other on said substrate, and forming first conductivity-type channel stopper regions below said oxide layers;

(c) forming a first oxide thin film layer for gates of said first and second MOSFETs on an upper surface of said substrate;

(d) forming said gates of said first and a second MOSFETs by depositing and doping a first layer of polycrystalline semiconducting material over said first oxide layer in said first and second regions;

(e) depositing a nitride thin film layer for masking on an upper surface of said substrate and removing said nitride layer from selected portions of said third region of said substrate;

(f) etching said first oxide layer of selected portions of said third region and implanting first conductivity-type ions into the etched portions to form an inactive base region of said first bipolar transistor;

(g) forming second oxide thin film layers on said third region of said substrate by employing said nitride layer as a mask;

(h) implanting first conductivity-type ions into selected portions of said third region of said substrate to form an active base region of said first bipolar transistor;

(i) implanting second conductivity-type ions to form a substrate connecting region of said first MOSFET of said first region, a collector connecting region of said third region, and drain and source regions of said second MOSFET;

(j) implanting first conductivity-type ions to form drain and source regions of said first MOSFET of said first region and a substrate connecting region of said second MOSFET of said second region;

(k) forming a third oxide thin film layer on the whole surface of said substrate and making an emitter connecting window of said first bipolar transistor;

(l) forming an emitter connecting portion of said first bipolar transistor with a second layer of polycrystalline semiconducting material on the upper portion of said third region; and (m) making windows for connecting with the drain and source regions of said first and second MOSFETs, the emitter, base and collector regions of said first bipolar transistor, and the substrate connecting regions of said first and second MOSFETs.

22. A method according to claim 21, comprising further steps of:

forming said element-isolation oxide thin film layers between said elements and a capacitor region, and forming first conductivity-type channel stopper regions below said element-isolation oxide layers;

forming a lower electrode of a capacitor in said capacitor region;

forming an oxide thin-film dielectric layer over the lower electrode of said capacitor simultaneously with the oxide thin film for the gates of said first and second MOSFETs;

forming an upper electrode of said capacitor over said capacitor dielectric layer simultaneously with said polycrystalline gates of said first and second MOSFETs;

making a connecting window of said capacitor region simultaneously with said connecting windows of each region; and making a connection with a conduction layer through the connecting window of said capacitor electrode.

23. A method according to claim 21, comprising further steps of:

forming said element-isolation oxide thin film layers between said elements and a region to form a substrate connection of a resistor region, and forming first conductivity-type channel stopper regions below said element-isolation oxide thin film layers;

forming an ion implantation region below the substrate connection region of said resistor region simultaneously with the ion implantation of each of said element regions;

forming a connecting window for a butting contact of said resistor region together with the window for forming said emitter connecting region of said first bipolar transistor;

forming a high resistivity portion, butting contact portion and low resistivity portion of said resistor region together with the polycrystalline emitter connecting portion of said first bipolar transistor;

implanting the second conductivity-type ions into the low resistivity portion and butting contact portion of said resistivity region;

making a connecting window of said resistor region together with the connecting windows of each region;

making a connection with a conduction layer through the connecting window of said resistor region.

24. A method according to claim 21, comprising further steps of:

forming said element-isolation oxide thin film layers between the regions of said transistors, a capacitor and a substrate connecting portion of a resistor region, and first conductivity-type channel stopper regions below said element-isolation oxide layer;

forming a lower electrode of said capacitor in said capacitor region;

forming an oxide thin film dielectric layer over the lower electrode of said capacitor together with said oxide thin film for the gates of said first and second MOSFETs;

forming an upper electrode of said capacitor over the dielectric layer of said capacitor together with said first and second MOSFETs;

forming an ion implantation region below the substrate connecting region of said capacitor together with ion implantation of each of said element regions;

making a connecting window for a butting contact of said resistor region together with the window for forming the emitter connecting region of said first bipolar transistor;

forming a high resistivity portion, butting contact portion and low resistivity portion of said resistor region together with said polycrystalline emitter connecting portion of said first bipolar transistor;

implanting second conductivity-type ions into the butting contact portion and low resistivity portion of said resistor region;

making connecting windows of said resistor regions and capacitor regions together with the connecting window of each region; and making a connection with the conduction layer through the connecting windows of said capacitor region.

25. A method for fabricating a semiconductor device containing a first MOSFET and first and second bipolar transistors in a first conductivity-type silicon substrate, comprising the steps of:

(a) implanting second conductivity-type ions into particular regions of said substrate and activating the implanted said regions to form a first region for a first MOSFET, a third region for a first bipolar transistor, and a fourth region for a second bipolar transistor;

(b) forming element-isolation oxide thin film layers between elements of said first MOSFET, first bipolar and second bipolar transistors to isolate said elements from each other on said substrate, and forming a first conductivity-type channel stopper region below said oxide layers;

(c) forming a first oxide thin film layer for a gate of said first MOSFET on an upper surface of said substrate;

(d) forming said gate of said first MOSFET by depositing and doping a second layer of polycrystalline semiconducting material over said first oxide thin film layer in said first region;

(e) depositing a nitride thin film layer for masking on a whole upper surface of said substrate and removing said nitride layer from selected portions of said third and fourth regions of said substrate;

(f) etching said first oxide layer of selected portions of said third and fourth regions and implanting first conductivity-type ions into the etched portions to form inactive base regions of said first and second bipolar transistors;

(g) forming second oxide thin film layers on said third and fourth regions of said substrate by employing said nitride layer as a mask;

(h) implanting first conductivity-type ions into selected portions of said third and fourth regions of said substrate to form active base regions of said first and second bipolar transistors;

(i) forming a third thin oxide thin-film layer on the whole surface of said substrate and etching said oxide layer without any separate mask to form oxide-layer spacers on sidewalls of the gate region of said first MOSFET;

(j) implanting second conductivity-type ions to form a substrate connecting region of said first MOSFET of said first region, a collector connecting region of said third and fourth regions, and an emitter region of said second bipolar transistor;

(k) implanting first conductivity-type ions to form drain and source regions of said first MOSFET of said first region;

(l) forming a fourth oxide thin film layer on the exposed surface of said substrate and making an emitter connecting window for said first bipolar transistor;

(m) forming an emitter connecting portion of said first bipolar transistor with a second polycrystalline layer on the upper portion of said third region; and (n) making windows for connecting with the drain and source regions of said first MOSFET, the emitter, base and collector region of said first and second bipolar transistors, and the substrate connecting regions of said first MOSFET.

26. A method according to claim 25, comprising further steps of:

forming said element isolation oxide thin film layers between said elements and a capacitor region, and first conductivity-type channel stopper regions below said element-isolation oxide layers;

forming a lower electrode of a capacitor in said capacitor region;

forming an oxide thin film dielectric layer over the lower electrode of said capacitor simultaneously with the oxide thin film for the gate of said first MOSFET;

forming an upper electrode of said capacitor over said capacitor dielectric layer simultaneously with said polycrystalline gate of said first MOSFET;

making a connecting window of said capacitor region simultaneously with said connecting windows of each region; and making a connection with a conduction layer through the connecting window of said capacitor electrode.

27. A method according to claim 25, comprising the further steps of:

forming said element-isolation oxide thin film layers between said elements and a region to form a substrate connection of a resistor region, and first conductivity-type channel stopper regions below said element-isolation oxide thin film layers;

forming an ion implantation region below the substrate connection of said resistor region simultaneously with ion implantation of each of said element regions;

forming a connecting window for a butting contact of said resistor region together with the window for said emitter connecting region of said first bipolar transistor;

forming a high resistivity portion, butting contact portion and low resistivity portion of said resistor region together with the polycrystalline emitter connecting portion of said first bipolar transistor;

implanting second conductivity-type ions into the low resistivity portion and butting contact portion of said resistivity region;

making a connecting window of said resistor region together with the connecting windows of each region; and making a connection with a conduction layer through the connecting window of said resistor region.

28. A method according to claim 25, comprising further steps of:

forming said element-isolation oxide thin film layers between the regions of said transistors, a capacitor and a substrate connecting portion of a resistor region, and first conductivity-type channel stopper regions below said element-isolation oxide layer;

forming a lower electrode of said capacitor in said capacitor region;

forming an oxide thin film dielectric layer over the lower electrode of said capacitor together with said oxide thin film for the gate of said first MOSFET;

forming an upper electrode of said capacitor over the dielectric layer of said capacitor together with said first MOSFET;

forming an ion implantation region below the substrate connecting region of said resistor together with ion implantation of each of said element regions;

making a connecting window for a butting contact of said resistor region together with the window forming the emitter connecting region of said first bipolar transistor;

forming a high resistivity portion, butting contact portion and low resistivity portion of said resistor region together with said polycrystalline emitter connecting portion of said first bipolar transistor;

implanting second conductivity-type ions into the butting contact portion and low resistivity portion of said resistor region;

making connecting windows of said resistor regions and capacitor region together with the connecting window of each region; and making a connection with a conducting layer through the connecting windows of said capacitor region.

29. A method for fabricating a semiconductor device containing a first MOSFET and first and second bipolar transistors in a first conductivity-type silicon substrate, comprising the steps of:

(a) implanting second conductivity-ions into particular regions of said substrate and activating the ion-implanted regions to form a first region for a first MOSFET, a third region for a first bipolar transistor, and a fourth region for a second bipolar transistor;

(b) forming element-isolation oxide thin film layers between elements of said first MOSFET, first bipolar and second bipolar transistors to isolate said elements from each other on said substrate, and forming first conductivity-type channel stopper regions below said oxide layers;

(c) forming a first oxide thin film layer for a gate of said first MOSFET on an upper surface of said substrate;

(d) forming said gate of said first MOSFET by depositing and doping a first layer of polycryatalline semiconducting material over said first oxide layer in said first region;

(e) depositing a nitride thin film layer for masking on the upper surface of said substrate and removing said nitride layer from selected portions of said third and fourth regions of said substrate;

(f) etching said first oxide layer of selected portions of said third and fourth regions and implanting first conductivity-type ions into the etched portions so as to form inactive base regions of said first and second bipolar transistors;

(g) forming second oxide thin film layers on said third and fourth regions of said substrate by employing said nitride layer as a mask;

(h) implanting first conductivity-type ions into selected portions of said third and fourth regions of said substrate to form an active base region of said first and second bipolar transistors;

(i) implanting second conductivity-type ions to form a substrate connecting region of said first MOSFET of said first region, a collector connecting region of said third and fourth regions, and an emitter region of said second bipolar transistor;

(j) implanting first conductivity-type ions to form drain and source regions of said first MOSFET of said first region;

(k) forming a third oxide thin film layer on the whole surface of said substrate and making an emitter connecting window of said first bipolar transistor;

(l) forming an emitter connecting portion of said first bipolar transistor with second polycrystalline layer on the upper portion of said third region; and (m) making windows for connecting with the drain and source regions of said first MOSFET, the emitter, base and collector regions of said first and second bipolar transistors, and the substrate connecting regions of said first MOSFET.

30. A method according to claim 29, comprising further steps of:

forming said element-isolation oxide thin film layers between said elements and a capacitor region, and first conductivity-type channel stopper regions below said element-isolation oxide layers;

forming the lower electrode of a capacitor in said capacitor region;

forming an oxide thin-film dielectric layer over the lower electrode of said capacitor simultaneously with the oxide thin film for the gate of said first MOSFET;

forming an upper electrode of said capacitor over said capacitor dielectric layer simultaneously with said polycrystalline gate of said first MOSFET;

making a connecting window of said capacitor region simultaneously with said connecting windows of each region; and making a connection with a conduction layer through the connecting window of said capacitor electrode.

31. A method according to claim 29, comprising further steps of:

forming said element-isolation oxide thin film layers between said elements and a region to form substrate connection of a resistor region, and first conductivity-type channel stopper regions below said element-isolation oxide thin film layers;

forming an ion implantation region below the substrate connection region of said resistor region simultaneously with ion implantation of each of said element regions;

forming a connecting window for a butting contact of said resistor region together with the window for forming said emitter connecting region of said first bipolar transistor;

forming a high resistivity portion, butting contact portion and low resistivity portion of said resistor region together with the polycrystalline emitter connecting portion of said first bipolar transistor;

implanting the second conductivity-type ions into the low resistivity portion and butting contact of said resistivity region;

making a connecting window of said resistor region together with the connecting windows of each region; and making a connection with a conduction layer through the connecting window of said resistor region.

32. A method according to claim 29, comprising further steps of:

forming said element-isolation oxide thin film layers between the regions of said transistors, a capacitor and a substrate connecting portion of a resistor region, and first conductivity-type channel stopper region below said element-isolation oxide layer;

forming a lower electrode of said capacitor in said capacitor region;

forming an oxide thin film dielectric layer over the lower electrode of said capacitor together with said oxide thin film for the gates of said first MOSFET;

forming an upper electrode of said capacitor over the dielectric layer of said capacitor together with said first MOSFET;

forming an ion implantation region below the substrate connecting region of said capacitor together with ion implantation of each of said element regions;

making a connecting window for a butting contact of said resistor region together with the windows for forming the emitter connecting region of said first bipolar transistor;

forming a high resistivity portion, butting contact portion and low resistivity portion of said resistor region together with said polycrystalline emitter connecting portion of said first bipolar transistor;

implanting the second conductivity-type ions into the butting contact portion and low resistivity portion of said resistor region;

making connecting windows of said resistor and capacitor regions together with the connecting window of each region; and making a connection with a conduction layer through the connecting windows.

* * * * *